United States Patent
Rangarajan et al.

(10) Patent No.: US 12,400,892 B2
(45) Date of Patent: *Aug. 26, 2025

(54) HIGH THROUGHPUT POLISHING MODULES AND MODULAR POLISHING SYSTEMS

(71) Applicant: Applied Materials, Inc., Santa Clara, CA (US)

(72) Inventors: Jagan Rangarajan, San Jose, CA (US); Edward Golubovsky, San Jose, CA (US); Jay Gurusamy, Santa Clara, CA (US); Steven M. Zuniga, Soquel, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/076,315

(22) Filed: Oct. 21, 2020

(65) Prior Publication Data

US 2021/0323119 A1    Oct. 21, 2021

Related U.S. Application Data

(63) Continuation of application No. 16/871,588, filed on May 11, 2020, which is a continuation of application
(Continued)

(51) Int. Cl.
*B24B 37/30* (2012.01)
*B24B 37/04* (2012.01)
(Continued)

(52) U.S. Cl.
CPC ...... *H01L 21/67745* (2013.01); *B24B 37/042* (2013.01); *B24B 37/30* (2013.01);
(Continued)

(58) Field of Classification Search
CPC ........... H01L 21/67745; H01L 21/6719; H01L 21/67219; H01L 21/6776; B24B 37/042; B24B 37/30; B24B 37/345
See application file for complete search history.

(56) References Cited

U.S. PATENT DOCUMENTS

| 2,998,680 A | 9/1961 | Lipkins |
| 3,518,798 A | 7/1970 | Boettcher |

(Continued)

FOREIGN PATENT DOCUMENTS

| CN | 101934491 B | 7/2012 |
| CN | 103962936 A | 8/2014 |

(Continued)

OTHER PUBLICATIONS

International Search Report dated Apr. 19, 2022 for Application No. PCT/US2021/043554.
(Continued)

*Primary Examiner* — Parviz Hassanzadeh
*Assistant Examiner* — Margaret Klunk
(74) *Attorney, Agent, or Firm* — Patterson + Sheridan, LLP

(57) ABSTRACT

Embodiments herein include high throughput density chemical mechanical polishing (CMP) modules and customizable modular CMP systems formed thereof. In one embodiment, a polishing module features a carrier support module, a carrier loading station, and a polishing station. The carrier support module features a carrier platform and one or more carrier assemblies. The one or more carrier assemblies each comprise a corresponding carrier head suspended from the carrier platform. The carrier loading station is used to transfer substrates to and from the carrier heads. The polishing station comprises a polishing platen. The carrier support module, the substrate loading station,
(Continued)

and the polishing station comprise a one-to-one-to-one relationship within each of the polishing modules. The carrier support module is positioned to move the one or more carrier assemblies between a substrate polishing position disposed above the polishing platen and a substrate transfer position disposed above the substrate loading station.

24 Claims, 15 Drawing Sheets

Related U.S. Application Data

No. 16/851,012, filed on Apr. 16, 2020, application No. 17/076,315 is a continuation of application No. 16/851,012, filed on Apr. 16, 2020.

(51) Int. Cl.
    *B24B 37/34*     (2012.01)
    *H01L 21/306*     (2006.01)
    *H01L 21/67*     (2006.01)
    *H01L 21/677*     (2006.01)

(52) U.S. Cl.
    CPC ...... *B24B 37/345* (2013.01); *H01L 21/30625* (2013.01); *H01L 21/6719* (2013.01); *H01L 21/67219* (2013.01); *H01L 21/6776* (2013.01)

(56) References Cited

U.S. PATENT DOCUMENTS

| | | | |
|---|---|---|---|
| 3,659,386 A | 5/1972 | Goetz et al. | |
| 3,665,648 A | 5/1972 | Yamanaka | |
| 3,731,435 A | 5/1973 | Boettcher et al. | |
| 3,762,103 A | 10/1973 | Nielsen | |
| 3,913,271 A | 10/1975 | Boettcher | |
| 4,020,600 A | 5/1977 | Day | |
| 4,021,278 A | 5/1977 | Hood et al. | |
| 4,141,180 A | 2/1979 | Gill, Jr. et al. | |
| 4,502,252 A | 3/1985 | Wabuchi | |
| 4,509,298 A | 4/1985 | Klievoneit | |
| 4,583,325 A | 4/1986 | Tabuchi | |
| 4,653,231 A | 3/1987 | Cronkhite et al. | |
| 4,944,119 A | 7/1990 | Gill, Jr. et al. | |
| 5,081,051 A | 1/1992 | Mattingly et al. | |
| 5,081,795 A | 1/1992 | Tanaka et al. | |
| 5,216,843 A | 6/1993 | Breivogel et al. | |
| 5,224,304 A | 7/1993 | Cesna | |
| 5,232,875 A | 8/1993 | Tuttle et al. | |
| 5,246,525 A | 9/1993 | Sato | |
| 5,317,778 A | 6/1994 | Kudo et al. | |
| 5,329,732 A | 7/1994 | Karlsrud et al. | |
| 5,361,545 A | 11/1994 | Nakamura | |
| 5,421,768 A | 6/1995 | Fujiwara et al. | |
| 5,443,416 A | 8/1995 | Volodarsky et al. | |
| 5,456,627 A | 10/1995 | Jackson et al. | |
| 5,478,435 A | 12/1995 | Murphy et al. | |
| 5,486,131 A | 1/1996 | Cesna et al. | |
| 5,498,199 A | 3/1996 | Karlsrud et al. | |
| 5,584,647 A | 12/1996 | Uehara et al. | |
| 5,599,423 A | 2/1997 | Parker et al. | |
| 5,649,854 A | 7/1997 | Gill, Jr. | |
| 5,692,947 A | 12/1997 | Talieh et al. | |
| 5,709,593 A | 1/1998 | Guthrie et al. | |
| 5,738,574 A * | 4/1998 | Tolles | B08B 1/52 451/247 |
| 5,804,507 A | 9/1998 | Perlov et al. | |
| 5,893,795 A | 4/1999 | Perlov et al. | |
| 5,931,724 A | 8/1999 | Perlov et al. | |
| 5,934,979 A | 8/1999 | Talieh | |
| 5,938,504 A | 8/1999 | Talieh | |
| 5,944,582 A | 8/1999 | Talieh | |
| 5,951,373 A * | 9/1999 | Shendon | B24B 37/32 451/287 |
| 5,957,764 A * | 9/1999 | Anderson | B24B 21/04 451/287 |
| 6,045,716 A | 4/2000 | Walsh et al. | |
| 6,080,046 A | 6/2000 | Shendon et al. | |
| 6,086,457 A | 7/2000 | Perlov et al. | |
| 6,095,908 A | 8/2000 | Torii | |
| 6,113,480 A * | 9/2000 | Hu | B24B 37/30 451/388 |
| 6,126,517 A | 10/2000 | Tolles et al. | |
| 6,135,868 A | 10/2000 | Brown et al. | |
| 6,155,768 A | 12/2000 | Bacchi et al. | |
| 6,156,124 A | 12/2000 | Tobin | |
| 6,159,080 A | 12/2000 | Talieh | |
| 6,179,690 B1 | 1/2001 | Talieh | |
| 6,200,199 B1 | 3/2001 | Gurusamy et al. | |
| 6,220,941 B1 | 4/2001 | Fishkin et al. | |
| 6,220,942 B1 | 4/2001 | Tolles et al. | |
| 6,227,948 B1 | 5/2001 | Khoury et al. | |
| 6,227,950 B1 | 5/2001 | Hempel et al. | |
| 6,231,428 B1 | 5/2001 | Maloney et al. | |
| 6,235,696 B1 * | 5/2001 | Hensen | A61Q 5/02 510/427 |
| 6,241,592 B1 | 6/2001 | Togawa et al. | |
| 6,283,822 B1 | 9/2001 | Togawa et al. | |
| 6,293,849 B1 | 9/2001 | Kawashima | |
| 6,293,853 B1 | 9/2001 | Perlov et al. | |
| 6,309,279 B1 * | 10/2001 | Bowman | B24B 37/345 451/41 |
| 6,322,427 B1 | 11/2001 | Li et al. | |
| 6,332,826 B1 * | 12/2001 | Katsuoka | B24B 53/017 451/6 |
| 6,343,979 B1 * | 2/2002 | Peltier | B24B 41/02 451/287 |
| 6,350,188 B1 | 2/2002 | Bartlett et al. | |
| 6,354,918 B1 | 3/2002 | Togawa et al. | |
| 6,354,922 B1 | 3/2002 | Sakurai et al. | |
| 6,354,926 B1 | 3/2002 | Walsh | |
| 6,358,126 B1 | 3/2002 | Jackson et al. | |
| 6,361,648 B1 | 3/2002 | Tobin | |
| 6,398,625 B1 | 6/2002 | Talieh | |
| 6,402,598 B1 | 6/2002 | Ahn et al. | |
| 6,409,582 B1 | 6/2002 | Togawa et al. | |
| 6,413,146 B1 | 7/2002 | Katsuoka et al. | |
| 6,413,356 B1 | 7/2002 | Chokshi et al. | |
| 6,413,873 B1 | 7/2002 | Li et al. | |
| 6,435,941 B1 | 8/2002 | White | |
| 6,443,823 B1 | 9/2002 | Tolles et al. | |
| 6,447,385 B1 * | 9/2002 | Togawa | B24B 37/345 451/287 |
| 6,454,630 B1 | 9/2002 | Tolles | |
| 6,475,914 B2 | 11/2002 | Han | |
| 6,572,730 B1 | 6/2003 | Shah | |
| 6,575,816 B2 | 6/2003 | Hempel et al. | |
| 6,579,148 B2 | 6/2003 | Hirokawa et al. | |
| 6,582,282 B2 | 6/2003 | Somekh | |
| 6,586,336 B2 | 7/2003 | Jeong | |
| 6,592,438 B2 | 7/2003 | Tolles et al. | |
| 6,592,439 B1 | 7/2003 | Li et al. | |
| 6,629,883 B2 | 10/2003 | Katsuoka et al. | |
| 6,682,408 B2 | 1/2004 | Sakurai et al. | |
| 6,716,086 B1 | 4/2004 | Tobin | |
| 6,780,773 B2 | 8/2004 | Li et al. | |
| 6,793,565 B1 | 9/2004 | Chadda et al. | |
| 6,805,616 B2 | 10/2004 | Kawashima | |
| 6,817,923 B2 | 11/2004 | Smith | |
| 6,841,057 B2 | 1/2005 | Wadensweiler et al. | |
| 6,848,976 B2 | 2/2005 | Somekh | |
| 6,852,017 B2 | 2/2005 | Brown | |
| 6,857,941 B2 | 2/2005 | Emami et al. | |
| 6,869,345 B2 | 3/2005 | Brown | |
| 6,872,129 B2 | 3/2005 | Tobin | |
| 6,878,044 B2 | 4/2005 | Sakurai et al. | |
| 6,896,584 B2 | 5/2005 | Perlov et al. | |
| 6,916,231 B2 | 7/2005 | Wakabayashi | |
| 6,918,814 B2 | 7/2005 | Katsuoka et al. | |
| 6,935,934 B2 | 8/2005 | Walsh | |
| 6,942,541 B2 | 9/2005 | Togawa et al. | |
| 6,942,545 B2 | 9/2005 | Jeong | |
| 6,949,466 B2 | 9/2005 | Jeong | |

(56) References Cited

U.S. PATENT DOCUMENTS

| | | | |
|---|---|---|---|
| 6,951,507 B2 | 10/2005 | Talieh | |
| 6,969,305 B2 | 11/2005 | Kimura et al. | |
| 6,974,371 B2 | 12/2005 | Chen et al. | |
| 6,977,036 B2 | 12/2005 | Wadensweiler et al. | |
| 7,004,815 B2 | 2/2006 | Jeong | |
| 7,011,569 B2 | 3/2006 | Shimizu et al. | |
| 7,044,832 B2 | 5/2006 | Yilmaz et al. | |
| 7,063,603 B2 | 6/2006 | Moore et al. | |
| 7,066,791 B2 | 6/2006 | Brown | |
| 7,070,475 B2 | 7/2006 | Manens et al. | |
| 7,074,109 B1 | 7/2006 | Bennett et al. | |
| 7,077,721 B2 | 7/2006 | Hu et al. | |
| 7,084,064 B2 | 8/2006 | Liu et al. | |
| 7,097,544 B1 | 8/2006 | Tolles et al. | |
| 7,101,253 B2 | 9/2006 | Olgado | |
| 7,101,255 B2 | 9/2006 | Katsuoka et al. | |
| 7,104,867 B2 | 9/2006 | Jeong | |
| 7,104,875 B2 | 9/2006 | Birang et al. | |
| 7,166,016 B1 | 1/2007 | Chen | |
| 7,198,551 B2 | 4/2007 | Talieh | |
| 7,238,090 B2 | 7/2007 | Tolles et al. | |
| 7,241,203 B1 | 7/2007 | Chen et al. | |
| 7,255,632 B2 | 8/2007 | Tolles et al. | |
| 7,273,408 B2 | 9/2007 | Chen et al. | |
| 7,303,467 B2 | 12/2007 | Birang et al. | |
| 7,390,744 B2 | 6/2008 | Jia et al. | |
| 7,614,939 B2 | 11/2009 | Tolles et al. | |
| 7,651,384 B2 | 1/2010 | Golden et al. | |
| 8,079,894 B2 | 12/2011 | Tolles et al. | |
| 8,137,162 B2 | 3/2012 | Abrahamians et al. | |
| 8,172,643 B2 | 5/2012 | Yilmaz et al. | |
| 8,202,140 B2 | 6/2012 | Hong et al. | |
| 8,308,529 B2 | 11/2012 | D'Ambra et al. | |
| 8,967,935 B2 | 3/2015 | Goodman et al. | |
| 8,968,055 B2 | 3/2015 | Chen et al. | |
| 9,017,138 B2 | 4/2015 | Chen et al. | |
| 9,138,857 B2* | 9/2015 | Lu | B24B 37/04 |
| 9,227,293 B2 | 1/2016 | David et al. | |
| 9,352,441 B2 | 5/2016 | Zuniga et al. | |
| 9,421,617 B2 | 8/2016 | Goodman et al. | |
| 9,434,045 B2 | 9/2016 | Yeh et al. | |
| 9,570,311 B2 | 2/2017 | Kuo et al. | |
| 9,592,585 B2 | 3/2017 | Lin et al. | |
| 9,610,673 B2 | 4/2017 | Torikoshi | |
| 9,687,955 B2 | 6/2017 | Watanabe et al. | |
| 10,040,166 B2 | 8/2018 | Nabeya et al. | |
| 10,293,455 B2 | 5/2019 | Nabeya et al. | |
| 10,478,938 B2 | 11/2019 | Torikoshi | |
| 10,486,285 B2 | 11/2019 | Miyazaki et al. | |
| 10,513,006 B2 | 12/2019 | Wu et al. | |
| 2001/0005665 A1* | 6/2001 | Hempel | B24D 9/10 451/41 |
| 2001/0024936 A1* | 9/2001 | Ishikawa | B24B 37/345 451/67 |
| 2002/0009954 A1 | 1/2002 | Togawa et al. | |
| 2002/0115392 A1 | 8/2002 | Kawashima | |
| 2002/0197946 A1 | 12/2002 | Emami et al. | |
| 2003/0003848 A1 | 1/2003 | Tobin | |
| 2003/0017706 A1 | 1/2003 | Moore et al. | |
| 2003/0022497 A1 | 1/2003 | Li et al. | |
| 2003/0051995 A1* | 3/2003 | Nobata | C25D 17/02 204/224 R |
| 2003/0202092 A1 | 10/2003 | Sadighi et al. | |
| 2004/0023495 A1 | 2/2004 | Butterfield et al. | |
| 2004/0053560 A1 | 3/2004 | Sun et al. | |
| 2004/0053566 A1 | 3/2004 | Tolles et al. | |
| 2004/0072445 A1 | 4/2004 | Sun et al. | |
| 2004/0072499 A1* | 4/2004 | Wakabayashi | B08B 1/32 451/65 |
| 2004/0097169 A1 | 5/2004 | Moore | |
| 2004/0137823 A1 | 7/2004 | Sakurai et al. | |
| 2004/0216842 A1* | 11/2004 | Jeong | B24B 37/042 156/345.11 |
| 2005/0070210 A1 | 3/2005 | Jeong | |
| 2005/0176349 A1 | 8/2005 | Yilmaz et al. | |
| 2005/0178666 A1 | 8/2005 | Tsai et al. | |
| 2005/0227586 A1 | 10/2005 | Jeong | |
| 2005/0227596 A1 | 10/2005 | Katsuoka et al. | |
| 2005/0233578 A1 | 10/2005 | Jia et al. | |
| 2005/0272352 A1 | 12/2005 | Polyak et al. | |
| 2005/0282472 A1 | 12/2005 | Jeong | |
| 2006/0003671 A1* | 1/2006 | Stumpf | B24B 37/345 451/41 |
| 2006/0003673 A1 | 1/2006 | Moore | |
| 2006/0030156 A1 | 2/2006 | Butterfield et al. | |
| 2006/0035563 A1 | 2/2006 | Kalenian et al. | |
| 2006/0046623 A1 | 3/2006 | Wang et al. | |
| 2006/0057812 A1 | 3/2006 | Liu et al. | |
| 2006/0070872 A1 | 4/2006 | Mavliev et al. | |
| 2006/0105680 A1 | 5/2006 | Jeong | |
| 2006/0172671 A1 | 8/2006 | Chen et al. | |
| 2006/0183407 A1 | 8/2006 | David | |
| 2007/0066200 A9 | 3/2007 | Li et al. | |
| 2007/0077861 A1* | 4/2007 | Chen | B24B 37/345 451/41 |
| 2007/0096315 A1 | 5/2007 | Manens et al. | |
| 2007/0128982 A1 | 6/2007 | Lee et al. | |
| 2007/0141954 A1* | 6/2007 | Chen | B24B 41/005 451/41 |
| 2008/0026681 A1 | 1/2008 | Butterfield et al. | |
| 2008/0035474 A1 | 2/2008 | Wang et al. | |
| 2008/0038993 A1 | 2/2008 | Jeong | |
| 2008/0047841 A1 | 2/2008 | Manens et al. | |
| 2008/0051014 A1* | 2/2008 | Jeong | B24B 37/12 451/61 |
| 2008/0156657 A1 | 7/2008 | Butterfield et al. | |
| 2008/0166958 A1 | 7/2008 | Golden et al. | |
| 2008/0242202 A1 | 10/2008 | Wang et al. | |
| 2008/0274673 A1 | 11/2008 | Adachi | |
| 2009/0068934 A1 | 3/2009 | Hong et al. | |
| 2009/0270015 A1 | 10/2009 | D'Ambra et al. | |
| 2009/0280727 A1* | 11/2009 | Karuppiah | B24B 27/0076 451/64 |
| 2009/0305612 A1 | 12/2009 | Miyazaki et al. | |
| 2010/0003902 A1 | 1/2010 | Yilmaz | |
| 2012/0064800 A1 | 3/2012 | Watanabe et al. | |
| 2012/0322345 A1 | 12/2012 | Rangarajan et al. | |
| 2013/0115862 A1 | 5/2013 | Rangarajan et al. | |
| 2013/0130601 A1* | 5/2013 | Lu | B24B 37/10 451/72 |
| 2013/0199405 A1 | 8/2013 | Rangarajan et al. | |
| 2013/0288578 A1 | 10/2013 | Chen et al. | |
| 2014/0138355 A1* | 5/2014 | Yavelberg | B24B 7/228 216/53 |
| 2014/0213157 A1 | 7/2014 | Torikoshi | |
| 2014/0220863 A1* | 8/2014 | Wu | B24B 37/005 451/11 |
| 2015/0044944 A1 | 2/2015 | Chen | |
| 2015/0314418 A1* | 11/2015 | Shinozaki | B24B 55/12 156/345.12 |
| 2015/0318179 A1 | 11/2015 | Yeh et al. | |
| 2015/0367464 A1 | 12/2015 | Chen | |
| 2016/0096211 A1 | 4/2016 | Zaki | |
| 2016/0099156 A1* | 4/2016 | Yamaguchi | H01L 21/67109 438/692 |
| 2018/0311784 A1 | 11/2018 | Trojan | |
| 2019/0118338 A1 | 4/2019 | Yamaguchi et al. | |
| 2021/0260716 A1* | 8/2021 | Lee | H01L 21/30625 |
| 2021/0323117 A1* | 10/2021 | Rangarajan | H01L 21/67219 |
| 2021/0323118 A1* | 10/2021 | Rangarajan | H01L 21/6719 |
| 2021/0323119 A1 | 10/2021 | Rangarajan et al. | |

FOREIGN PATENT DOCUMENTS

| | | |
|---|---|---|
| CN | 104303272 A | 1/2015 |
| CN | 102725830 B | 3/2016 |
| CN | 106737055 A | 5/2017 |
| CN | 104303272 B | 6/2017 |
| CN | 103962936 B | 8/2018 |
| CN | 105904335 B | 4/2019 |
| CN | 113161223 A | 7/2021 |
| DE | 3411120 A1 | 11/1984 |

(56) References Cited

FOREIGN PATENT DOCUMENTS

| | | |
|---|---|---|
| DE | 3737904 A1 | 5/1989 |
| EP | 1738871 B1 | 2/2009 |
| JP | H09-174420 A | 7/1997 |
| JP | 2001038615 A * | 2/2001 ............. B24B 1/061 |
| JP | 2004-518270 A | 6/2004 |
| KR | 10-2004-0110511 A | 12/2004 |
| KR | 10-2010-0060662 A | 6/2010 |
| KR | 10-2021-0054566 A | 5/2021 |
| WO | 2019089467 A1 | 5/2019 |

OTHER PUBLICATIONS

CN Office Action dated Apr. 30, 2024 for Application No. 202011284917.0.
European Search Report dated May 20, 2025 for Application No. EP 21 95 2070.
JP Office Action dated May 20, 2025 for Application No. JP2021-127996.
Chinese Office Action dated Apr. 25, 2025 for Application No. 202011284917.0.
TW Office Action and Search Report dated Apr. 27, 2025 for Application No. TW110127896.

* cited by examiner

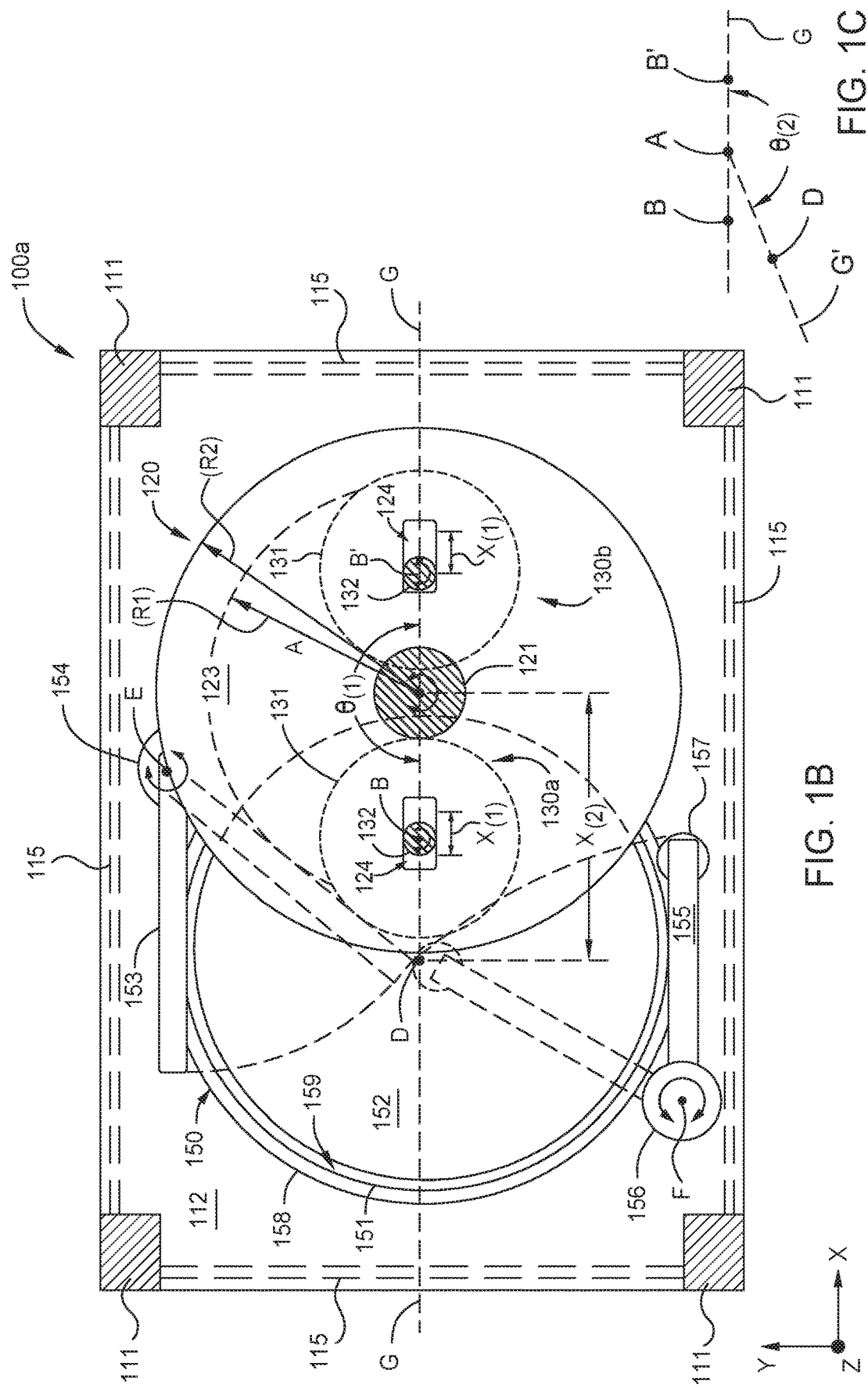

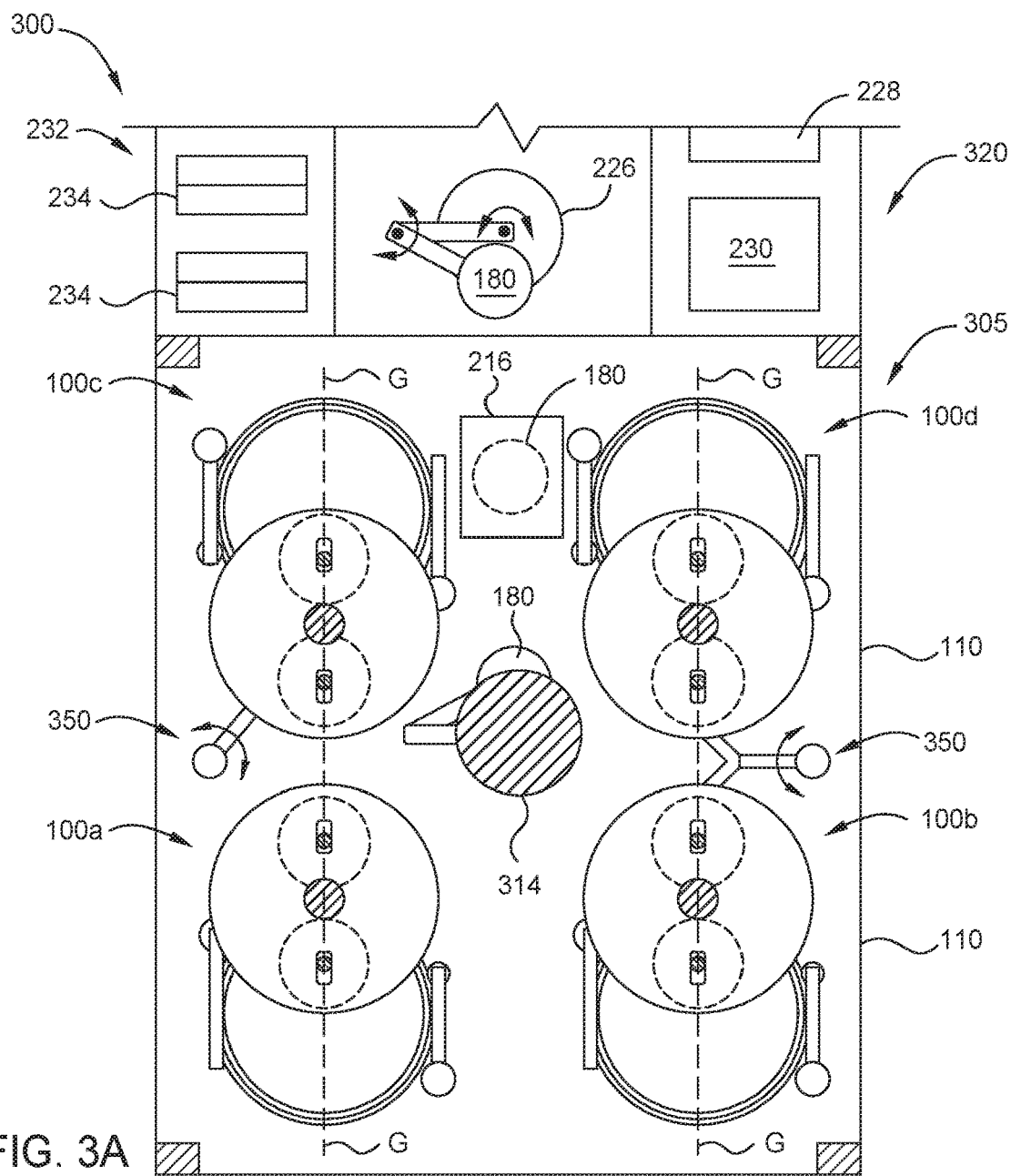
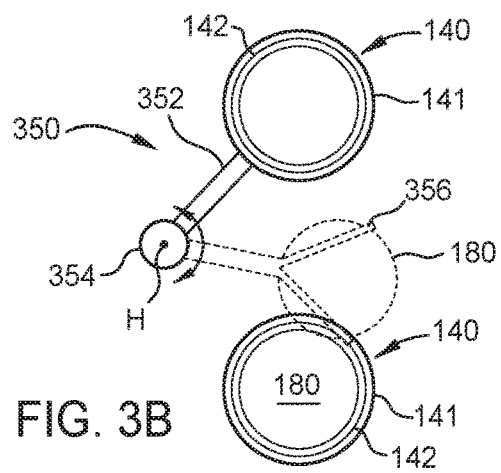
FIG. 3A
FIG. 3B

HIGH THROUGHPUT POLISHING MODULES AND MODULAR POLISHING SYSTEMS

CROSS-REFERENCE TO RELATED APPLICATIONS

This application is a continuation of co-pending U.S. patent application Ser. No. 16/851,012, filed Apr. 16, 2020, and a continuation of co-pending U.S. patent application Ser. No. 16/871,588, filed May 11, 2020, which is a continuation of co-pending U.S. patent application Ser. No. 16/851,012, filed Apr. 16, 2020, all of which are incorporated by reference herein in their entireties.

BACKGROUND

Field

Embodiments described herein generally relate to equipment used in the manufacturing of electronic devices, and more particularly, to a modular chemical mechanical polishing (CMP) system which may be used to polish or planarize the surface of a substrate in a semiconductor device manufacturing process.

Description of the Related Art

Chemical mechanical polishing (CMP) is commonly used in the manufacturing of high-density integrated circuits to planarize or polish a layer of material deposited on a substrate. In a typical CMP process, a substrate is retained in a carrier head that presses the backside of the substrate towards a rotating polishing pad in the presence of a polishing fluid. Material is removed across the material layer surface of the substrate in contact with the polishing pad through a combination of chemical and mechanical activity which is provided by the polishing fluid and a relative motion of the substrate and the polishing pad. Typically, after one or more CMP processes are complete a polished substrate will be further processed to one or a more post-CMP substrate processing operations. For example the polished substrate may be further processed using one or a combination of cleaning, inspection, and measurement operations. Once the post-CMP operations are complete a substrate can be sent out of a CMP processing area to the next device manufacturing process, such as a lithography, etch, or deposition process.

To conserve valuable manufacturing floor space and reduce labor costs, a CMP system will commonly include a first portion, e.g., a back portion, comprising a plurality of polishing stations and a second portion, e.g., a front portion which has been integrated with the first portion to from a single polishing system. The first portion may comprise one or a combination of post-CMP cleaning, inspection, and/or pre or post-CMP metrology stations. Often the first portion of a CMP system can be customized during the fabrication thereof to more particularly address the needs of specific equipment customers.

For example, a CMP system may be customized to vary the number and arrangement of cleaning, inspection, or metrology stations in response to an intended use of the polishing system, such as for the type of substrate polishing operation intended to be used therewith. The second portion of the CMP system is typically less customizable than the first portion so that the number and arrangement of polishing stations, and the number and an arrangement of substrate handling systems used to transfer substrates therebetween are fixed. Further, the substrate processing throughput in a typical second portion of a multi-platen CMP system is often limited by substrate loading and unloading operations thereinto and/or substrate transfer operations between the platens thereof. Thus, particularly for polishing processes having shorter polishing time requirements, the throughput density (substrates processed per unit time per unit area of manufacturing floor space) of a CMP system will be undesirably limited by the system's substrate loading/unloading and handling configuration.

Accordingly, what is needed in the art are modular CMP systems which may be customized upon customer request. Further needed are modular CMP systems where the individual polishing modules are disposed in such an arrangement that the substrate throughput of the polishing module is not limited by substrate loading and substrate unloading operations respectively thereto and therefrom.

SUMMARY

The present disclosure is generally related to high throughput density chemical mechanical polishing (CMP) modules and customizable modular CMP systems comprised thereof.

In one embodiment, a polishing module features a carrier support module, a carrier loading station, and a polishing station. The carrier support module features a carrier platform suspended from an overhead support and one or more carrier assemblies. The one or more carrier assemblies each comprise a corresponding carrier head suspended from the carrier platform. The carrier loading station is used to transfer substrates to and from the carrier heads. The polishing station comprises a polishing platen. The carrier support module, the carrier loading station, and the polishing station comprise a one-to-one-to-one relationship within each of the polishing modules. The carrier support module is positioned to move the one or more carrier assemblies between a substrate polishing position disposed above the polishing platen and a substrate transfer position disposed above the carrier loading station.

In another embodiment a modular polishing system includes a first portion and a second portion coupled to the first portion. The second portion features a plurality of polishing modules. At least one of the polishing modules features a carrier support module, a carrier loading station, and a polishing station. The carrier support module features a carrier platform suspended from an overhead support, and one or more carrier assemblies. The one or more carrier assemblies each comprise a corresponding carrier head suspended from the carrier platform. The carrier loading station is used to transfer substrates to and from the carrier heads. The polishing station comprises a polishing platen. The carrier support module, the carrier loading station, and the polishing station comprise a one-to-one-to-one relationship within each of the polishing modules. The carrier support module is positioned to move the one or more carrier assemblies between a substrate polishing position disposed above the polishing platen and a substrate transfer position disposed above the carrier loading station.

In another embodiment a modular polishing system includes a first portion and a second portion coupled to the first portion. The first portion features one of a plurality of system loading stations, one or more substrate handlers, one or more metrology stations, one or more post-CMP cleaning system, one or more location specific polishing (LSP) systems, or a combination thereof. The second portion features a plurality of polishing modules. At least one of the polishing modules features a carrier support module, a carrier loading station, and a polishing station. The carrier support module features a carrier platform suspended from an overhead support, and one or more carrier assemblies. The one or more carrier assemblies each comprise a corresponding carrier head suspended from the carrier platform. The carrier loading station is used to transfer substrates to and from the carrier heads. The polishing station comprises a polishing platen. The carrier support module, the carrier loading station, and the polishing station comprise a one-to-one-to-one relationship within each of the polishing modules. The carrier support module is positioned to move the one or more carrier assemblies between a substrate polishing position disposed above the polishing platen and a substrate transfer position disposed above the carrier loading station.

In some embodiments, one or more of the carrier loading stations of the above described embodiments features a buff platen that may be used to buff, e.g., soft polish, the substrate surface before and/or after the substrate is processed at the polishing station. In some of those embodiments, the buff platen is movable in a vertical direction, i.e., the Z-direction to make room for substrate transfer to and from the carrier loading station using a substrate transfer and/or to facilitate substrate transfer to and from the carrier heads. In some embodiments, one or more of the carrier loading stations is configured as an edge correction station, e.g., to remove material from regions proximate to the circumferential edge of the substrate before and/or after the substrate is processed at the polishing station.

In another embodiment, a modular polishing system is provided. The modular polishing system includes a first modular frame defining a first processing region. Disposed in the first processing region, the modular polishing system includes a cleaning system and a first substrate handler. The first substrate handler may be used to transfer substrates from a second processing region to the cleaning system. The modular polishing system further includes one or more second modular frames coupled to the first modular frame. The one or more second modular frames define the second processing region having at least two polishing modules disposed therein. Each individual polishing module of the at least two polishing modules includes a polishing platen, a carrier loading station, and a substrate carrier transport system for moving a substrate carrier between the polishing platen and the carrier loading station.

In some embodiments of the modular polishing system, the substrate carrier of at least one of the two polishing modules is a first substrate carrier and the at least one polishing module further includes a second substrate carrier. In those embodiments, the substrate carrier transport system is configured to concurrently position the first substrate carrier above the polishing platen and the second substrate carrier above the carrier loading station.

In some embodiments, the modular polishing system further includes a third substrate processing region disposed between the first processing region and the second processing region, the third substrate processing region including one or more processing systems disposed therein. The one or more processing systems include one or more location specific polishing modules, one or more metrology stations, one or more buffing stations, or a combination thereof. In those embodiments, the one or more processing systems in the third processing region are disposed in an arrangement that allows substrates to be directly transferred thereto and therefrom using the first substrate handler. In some of those embodiments, the one or more processing systems comprises a plurality of processing systems, and wherein at least two of the plurality of processing systems are disposed in a vertical arrangement with respect to one another. In some embodiments, the modular polishing system further includes one or more processing systems disposed in the first processing region.

In some embodiments, the modular polishing system further includes a plurality of system loading stations. In those embodiments, the first processing region is disposed between the plurality of system loading stations and the second processing region. In some embodiments, the modular polishing system further includes a plurality of system loading stations. In those embodiments, the first substrate handler is disposed between the cleaning system and second processing region, and wherein at least a portion of the one or more second modular frames is disposed proximate to the plurality of system loading stations.

In another embodiment, a modular system includes a first modular frame defining a first processing region. Disposed in the first processing region, the modular polishing system includes a cleaning system and a first substrate handler. The first substrate handler may be used to transfer substrates from a second processing region to the cleaning system. The modular polishing system further includes one or more second modular frames coupled to the first modular frame. The one or more second modular frames define the second processing region having a second substrate handler disposed therein. The modular polishing system further includes two first polishing modules disposed in the second processing region. Each individual polishing module of the two first polishing modules includes a polishing platen, a carrier loading station, and a substrate carrier transport system for moving a substrate carrier between the polishing platen and the carrier loading station. In this embodiment, the polishing platens and the carrier loading stations of the two first polishing modules are disposed in an arrangement that allows substrates to be directly transferred to and from the carrier loading stations using the second substrate handler.

In some embodiments of the modular system, the two first polishing modules are disposed in a side-by-side arraignment where each of the respective polishing platens thereof are closer to the first processing region than are the respective carrier loading stations thereof. In some embodiments, the substrate carrier of at least one of the two first polishing modules is a first substrate carrier and the at least one first polishing module further includes s a second substrate carrier. In those embodiments, the substrate carrier transport system is configured to concurrently position the first substrate carrier above the polishing platen and the second substrate carrier above the carrier loading station.

In some embodiments, the modular system includes a third substrate processing region disposed between the first processing region and the second processing region and one or more processing systems disposed in the third processing region. Here, the one or more processing systems comprise one or more location specific polishing modules, one or more metrology stations, one or more buffing stations, or a combination thereof. In some of those embodiments, the one or more processing systems comprises a plurality of processing systems and at least two of the plurality of processing systems are disposed in a vertical arrangement with respect to one another.

In some embodiments, the modular polishing system further includes one or more second polishing modules disposed in the second processing region. In those embodiments, each individual second polishing module of the one or more second polishing modules includes a polishing platen, a carrier loading station, and a substrate carrier transport system. In those embodiments, the polishing platens and the carrier loading stations of the two first polishing modules and the one or more second polishing modules are disposed in an arrangement that allows substrates to be directly transferred to and from each of the carrier loading stations thereof using the second substrate handler.

In some embodiments of the modular system, the carrier loading stations of the two first polishing modules and the two second polishing modules define a substrate handling region having the second substrate handler disposed therein. In those embodiments, the second substrate handler is positioned to transfer a substrate from the carrier loading station of any one of the two first polishing modules and the two second polishing modules to the carrier loading station of any other one of the carrier loading stations of the two first polishing modules and the two second polishing modules. In some of those embodiments, the modular system further includes one or more third polishing modules disposed in the second processing region where each individual third polishing module of the one or more third polishing modules comprises a polishing platen, a carrier loading station, and a substrate carrier transport system. In those embodiments, the polishing platens and the carrier loading stations of the one or more third polishing modules are disposed in an arrangement that allows substrates to be directly transferred to and from each of the carrier loading stations thereof using a third substrate handler.

In some embodiments, the polishing system further includes a substrate exchanger disposed between one of the two first polishing modules and one of the one or more second polishing modules. In those embodiments, the carrier loading station the one of the two first polishing modules is a first carrier loading station, a carrier loading station of one of the one or more second polishing modules is a second carrier loading station, and the substrate exchanger is dedicated to moving substrates between the first carrier loading station and the second carrier loading station. In some of those embodiments, the substrate exchanger is movable about an axis to swing a substrate between the first and second carrier loading stations.

In some embodiments, the modular system further includes a plurality of system loading stations, wherein the first processing region is disposed between the plurality of system loading stations and the second processing region. In some embodiments, modular system includes a plurality of system loading stations, where the first substrate handler is disposed between the cleaning system and the second processing region, and at least a portion of the one or more second modular frames is disposed proximate to the plurality of system loading stations.

In another embodiment, a modular polishing system includes one or more first modular frames defining a first processing region. The one or more first modular frames, and thus the first processing region, have a first end and a second end that is opposite to the first end. The modular polishing system further includes a linear substrate handling system and a plurality of polishing module pairs disposed in the first processing region. The linear substrate handling system includes a first linear member extending from a location proximate to the first end to a location proximate to the second end and a first substrate handler movably coupled to the first linear member. Each polishing module pair includes two polishing modules disposed on opposite sides of the linear member. Each polishing module of the two polishing modules includes a polishing platen, a carrier loading station, and a substrate carrier transport system. The polishing platen is disposed distal from the linear member, the carrier loading station is disposed proximate to the linear member, and the substrate carrier transport system may be used to move a substrate carrier between the polishing platen and the carrier loading station.

In some embodiments of the modular polishing system, at least one polishing module of the two polishing modules in a polishing module pair includes a first substrate carrier and a second substrate carrier. In those embodiments, the substrate carrier transport system is configured to concurrently position the first substrate carrier above the polishing platen and the second substrate carrier above the carrier loading station and at least a portion of a substrate moved from the first end towards the second end of the first processing region using the first substrate handler of the linear handling system will pass between the carrier loading station and the second substrate carrier positioned thereabove.

In some embodiments of the modular polishing system, the one or more first modular frames includes a horizontal member defining a lower boundary of the first processing region and the linear substrate handling system further includes a second linear member extending from a location proximate to the first end to a location proximate to the second end and a second substrate handler movably coupled to the second linear member. Typically, in those embodiments, the first linear member is disposed above the horizontal member and the second linear member is disposed below the horizontal member. In some embodiments of the modular polishing system, the one or more first modular frames are coupled to a second modular frame, where the second modular frame defines a second processing region having a cleaning system disposed therein.

In another embodiment, a modular polishing system includes a first modular frame defining a first processing region, a cleaning system disposed in the first processing region, one or more second modular frames coupled to the first modular frame, and a linear substrate handling system. In this embodiment, the one or more second modular frames define a second processing region having a plurality of polishing modules disposed therein. The individual polishing modules each include a polishing platen, a carrier loading station, and a substrate carrier transport system for moving a substrate carrier between the polishing platen and the carrier loading station. Here, the carrier loading stations in each of the plurality of polishing modules are disposed proximate to a perimeter of the second processing region. The linear handling system includes one or more linear members disposed between the carrier loading stations and the perimeter of the second processing region and one or more substrate handlers movably coupled to the one or more linear members.

In another embodiment, a polishing system is provided. The polishing system includes one or more first modular frames defining a first processing region and a plurality of polishing modules disposed in the first processing region. Each individual one of the plurality of polishing modules includes a polishing platen, a carrier loading station, and a carrier transport system for moving a substrate carrier between the polishing platen and the carrier loading station. The polishing system further includes a substrate handling system for transferring a substrate between the carrier loading station of any one of the plurality of polishing modules and the carrier loading station of any other one of the plurality of polishing modules. Here, the any one of the plurality of polishing modules is a first station configured for a first polishing stage of a multi-stage substrate polishing sequence and the any other one of the plurality of polishing modules is a second station configured for a second polishing stage of the multi-stage substrate polishing sequence. In some embodiments of the polishing system the one or more of the carrier loading stations includes a substrate buffing station, a substrate carrier cleaning station, a metrology station, a substrate edge correction station, or a combination thereof.

In some embodiments, the polishing system further includes a plurality of the second stations and a computer readable medium having instructions stored thereon for a substrate processing method. The method includes (a) urging a first substrate against a first polishing pad, (b) determining an available station of the plurality of second stations, (c) transferring the first substrate to the available second station of the plurality of second stations, (d) urging the first substrate against a second polishing pad, and (e) repeating (a)-(d) with a second substrate. Here, the first polishing pad is disposed on the polishing platen of the first station and the second polishing pad is disposed on the polishing platen of the available second station.

In some embodiments of the polishing system, at least one of the plurality of polishing modules includes a first substrate carrier and a second substrate carrier, and the polishing system further includes a computer readable medium having instructions stored thereon for a substrate processing method. The method includes (a) urging a first substrate against a polishing pad disposed on the polishing platen of the at least one polishing module in the presence of a first polishing fluid where the first substrate is disposed in the first substrate carrier, and (b) concurrent with (a), unloading an at least-partially-polished substrate from the second substrate carrier and loading a to-be-polished second substrate into the second substrate carrier.

In some embodiments of the polishing system, the plurality of polishing modules include at least four polishing modules, the carrier loading stations of the at least four polishing modules collectively define a substrate handling region, the substrate handling system includes a substrate handler disposed in the substrate handling region, and the substrate handler is positioned to transfer a substrate from the carrier loading station of any one of the at least four polishing modules to the carrier loading station of any other one of the at least four polishing modules. In some of those embodiments, the substrate handling system further includes a substrate exchanger disposed between two polishing modules of the at least four polishing modules, the carrier loading station of one of the two polishing modules is a first carrier loading station and a carrier loading station of the other of the two polishing modules is a second carrier loading station, and the substrate exchanger is dedicated to moving substrates between the first carrier loading station and the second carrier loading station. In some of those embodiments, the substrate exchanger is movable about an axis to swing a substrate between the first and the second carrier loading stations.

In some embodiments of the polishing system, the substrate carrier of at least one of the plurality of polishing modules is a first substrate carrier and the at least one polishing module further comprises a second substrate carrier, and the carrier transport system of the at least one polishing module is configured to concurrently position the first substrate carrier above the polishing platen and the second substrate carrier above the carrier loading station. In some of those embodiments, the carrier transport system of the at least one of the plurality of polishing modules includes a carrier support module. In some of those embodiments, the carrier support module includes a support member, a carrier platform coupled to the support member, and the first and second substrate carriers, which are suspended from the carrier platform. In other ones of those embodiments, the carrier support module includes a track assembly coupled to an overhead support of the one or more first modular frames, a plurality of carriages coupled to the track assembly, and the first and second substrate carriers respectively coupled to corresponding ones of the plurality of carriages.

In some embodiments of the polishing system, the plurality of polishing modules includes at least two polishing modules disposed in the first processing region. In those embodiments, the polishing system further includes a second modular frame coupled to the first modular frame where the second modular frame defines a second processing region and a post-polishing cleaning system disposed in the second processing region. Here, the substrate handling system includes a substrate handler disposed in the second processing region. The two polishing modules are disposed in an arrangement that allows substrates to be transferred to and from the carrier loading stations thereof using the substrate handler. In some of those embodiments, the polishing system further includes a third processing region disposed between the first processing region and the second processing region and one or more processing systems disposed in the third processing region. Here, the one or more processing systems include one or more location specific polishing modules, one or more metrology stations, one or more buffing stations, or a combination thereof. The one or more processing systems in the third processing region are disposed in an arrangement that allows substrates to be directly transferred thereto and therefrom using the substrate handler.

In another embodiment, a substrate processing method includes (a) urging a first substrate against a first polishing pad, where the first polishing pad is disposed on a polishing platen of a first polishing module of a polishing system. The polishing system includes the first polishing module and a plurality of second polishing modules. Each individual one of the first and second polishing modules includes a polishing platen and a carrier loading station. The first polishing module is configured for a first polishing stage of a multi-stage substrate polishing sequence and the plurality of second polishing modules are each configured for a second stage of the multi-stage substrate polishing sequence. Each of the first and second polishing modules includes a polishing platen, a substrate carrier loading station, and a substrate handling system for transferring a substrate between the carrier loading station of the first polishing module and any one of the plurality of polishing modules and any one of the carrier loading stations of the plurality of second polishing modules. The method further includes (b) determining an available second polishing module of the plurality of second polishing modules, (c) transferring the first substrate to the available second polishing module of the plurality of second polishing modules, (d) urging the first substrate against a second polishing pad in the presence of a second polishing fluid, and (e) repeating (a)-(d) on a second substrate. Here, the second polishing pad is disposed on the polishing platen of the available polishing module.

In some embodiments of the substrate processing method, each individual one of the first and second polishing modules further includes a carrier transport system for moving a substrate carrier between the polishing platen and the carrier loading station.

In some embodiments of the substrate processing method, the first polishing module includes a first substrate carrier and a second substrate carrier. In those embodiments, the method further includes, concurrent with urging the first substrate against the first polishing pad, loading the second substrate into the second substrate carrier. In some of those embodiments, a carrier transport system of the first polishing module includes a carrier support module and the carrier support module includes a support member, a carrier platform coupled to the support member, and the first and second substrate carriers, which are suspended from the carrier platform. In other embodiments, the carrier support module includes a track assembly, a plurality of carriages coupled to the track assembly, and the first and second substrate carriers respectively coupled to corresponding ones of the plurality of carriages.

In some embodiments of the substrate processing method, the first substrate is transferred from the first polishing module to the available second polishing module using a dedicated substrate exchanger disposed therebetween.

In some embodiments of the substrate processing method, the first polishing module and plurality of second polishing modules includes at least four polishing modules, the carrier loading stations of the at least four polishing modules collectively define a substrate handling region, the substrate handling system includes a substrate handler disposed in the substrate handling region, and the substrate handler is positioned to transfer a substrate from the carrier loading station of any one of the at least four polishing modules to the carrier loading station of any other one of the least four polishing modules.

In some embodiments of the substrate processing method, the carrier loading station includes a substrate buffing station, a substrate carrier cleaning station, a metrology station, a substrate edge correction station, or a combination thereof.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1B is a top down section view of the polishing module of FIG. 1A taken along line A-A'.

FIG. 1C schematically illustrates an alternate arrangement of the polishing module of FIGS. 1A-1B.

FIG. 3A is a schematic top down sectional view of a modular polishing system comprising a plurality of the polishing modules set forth in FIGS. 1A-1B, according to another embodiment.

FIG. 3B is a schematic top down view of an inter-module substrate exchanger, according to one embodiment, which may be used with any of the modular polishing systems described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to chemical mechanical polishing (CMP) systems used in the semiconductor device manufacturing industry. More particularly, embodiments herein relate to high throughput density chemical mechanical polishing (CMP) modules and customizable modular CMP systems comprised thereof.

Figure 1A:
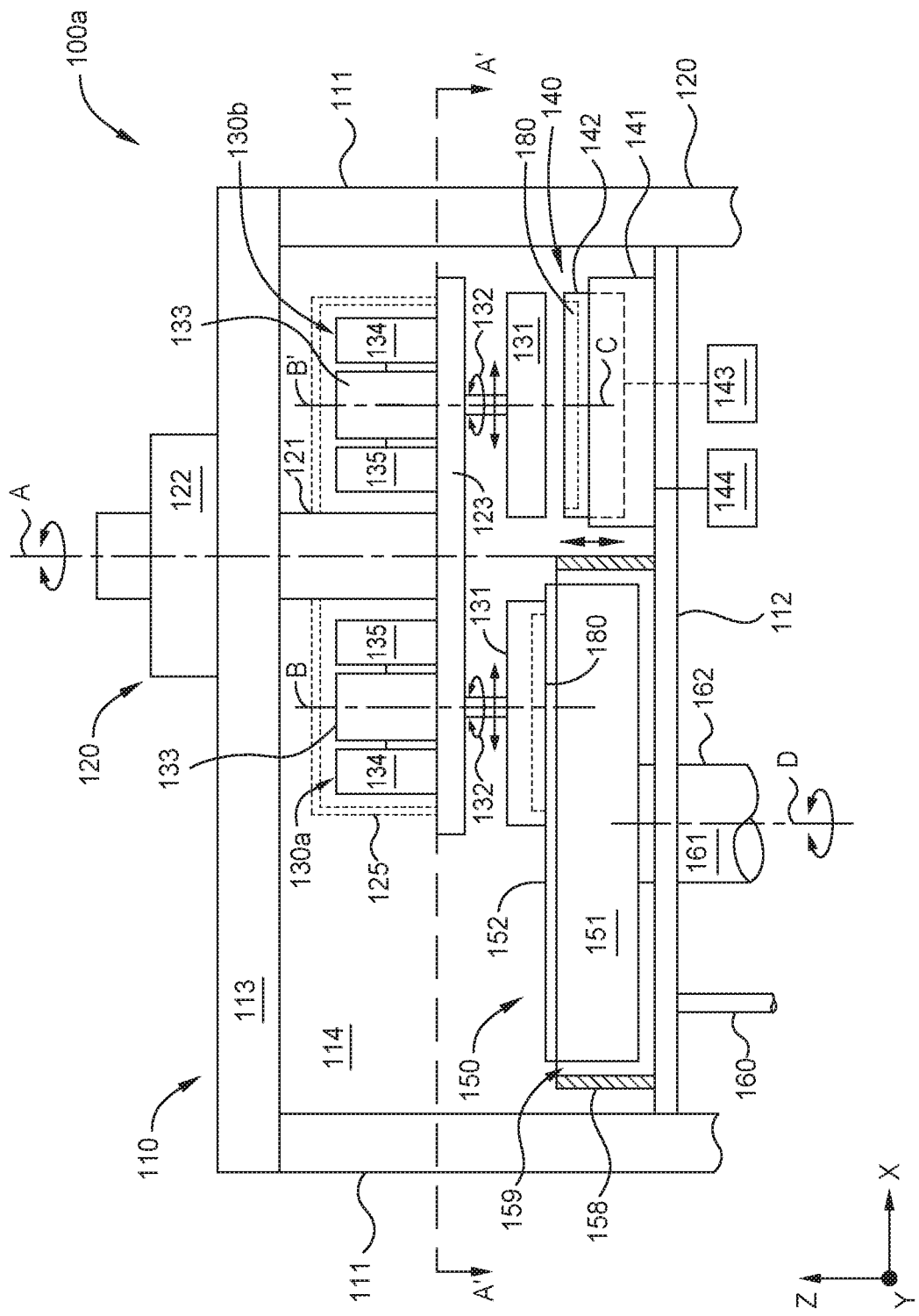
FIG. 1A is a schematic side view of a polishing module, according to one embodiment, which may be used as one or more of a plurality of polishing modules in one or more of the modular polishing systems described herein.

FIG. 1A is a schematic side view of a polishing module, according to one embodiment, which may be used as one or more of a plurality of polishing modules of the modular polishing systems described herein. FIG. 1B is a top down sectional view of FIG. 1A taken along line A'-A'.

Here, the polishing module 100a is disposed within a modular frame 110 and includes a carrier support module 120 comprising a first carrier assembly 130a and a second carrier assembly 130b where each of the carrier assemblies 130a, b includes a corresponding carrier head 131. The polishing module 100a further includes a station for loading and unloading substrates to and from the carrier heads, herein a carrier loading station 140, and a polishing station 150. In embodiments herein, the carrier support module 120, the carrier loading station 140, and the polishing station 150 are disposed in a one-to-one-to-one relationship within the modular frame 110. This one-to-one-to-one relationship and the arrangements described herein facilitate the simultaneous substrate loading/unloading and polishing operations of at least two substrates 180 to enable the high throughput density substrate handling methods described herein.

Here, the modular frame 110 features a plurality of vertically disposed supports, herein upright supports 111, a horizontally disposed tabletop 112, and an overhead support 113 disposed above the tabletop 112 and spaced apart therefrom. The upright supports 111, the tabletop 112, and the overhead support 113 collectively define a processing region 114. Here, the modular frame 110 has a generally rectangular footprint when viewed from the top down (FIG. 1B) where four individual ones of the upright supports 111 are respectively coupled to the four outward facing corners of both the tabletop 112 and the overhead support 113. In other embodiments, the tabletop 112 and the overhead support 113 may be coupled to upright supports 111 at other suitable locations, which have been selected to prevent interference between the upright supports 111 and substrate handling operations. In other embodiments, the modular frame 110 may comprise any desired footprint shape when viewed from the top down.

In some embodiments, the polishing module 100a further includes a plurality of panels 115 (shown in phantom in FIG. 1B) each vertically disposed between adjacent corners of the modular frame 110 to enclose and isolate the processing region 114 from other portions of a modular polishing system 100. In those embodiments, one or more the panels 115 will typically have a slit shaped opening (not shown) formed therethrough to accommodate substrate transfer into and out of the processing region 114.

Here, the carrier support module 120 is suspended from the overhead support 113 and includes a support shaft 121 disposed through an opening in the overhead support 113, an actuator 122 coupled to the support shaft 121, and a carrier platform 123 coupled to, and supported by, the support shaft 121. The actuator 122 is used to rotate or alternately pivot the support shaft 121, and thus the carrier platform 123, about a support shaft axis A in the clockwise and counterclockwise directions. In other embodiments (not shown), the support shaft 121 may be mounted on and/or coupled to the base 112 to extend upwardly therefrom. In those embodiments, the carrier platform 121 is coupled to, disposed on, and/or otherwise supported by an upper end of the support shaft 121. In those embodiments, the support shaft 121 may be vertically disposed in an area between the carrier loading station 140 and the polishing station 150 which are described below.

As shown, the carrier platform 123 provides support to the carrier assemblies 130a, b and is coupled to an end of the support shaft 121 which is disposed in the processing region 114. Here, the carrier platform 123 comprises an upper surface and a lower tabletop-facing surface which is opposite of the upper surface. The carrier platform 123 is shown as a cylindrical disk but may comprise any suitable shape sized to support the components of the carrier assemblies 130a, b. The carrier platform 123 is typically formed of a relatively light weight rigid material, such as aluminum which is resistant to the corrosive effects of commonly used polishing fluids. Here, the carrier platform 123 has a plurality of openings 124 (FIG. 1B) disposed therethrough. In some embodiments, the carrier support module 120 further includes a housing 125 (shown in phantom in FIG. 1A) disposed on the upper surface of the carrier platform 123. The housing 125 desirably prevents polishing fluid overspray from the polishing process from coming into contact with, and causing corrosion to, the components disposed on or above the carrier platform 123 in a region defined by the housing 125. Beneficially, the housing 125 also prevents contaminants and/or other defect causing particles from transferring from the components contained therein to the substrate processing regions, which might otherwise cause damage to the substrate surface, such as scratches and/or other defectivity.

As shown, the carrier platform 123 provides support for two carrier assemblies, the first carrier assembly 130a and the second carrier assembly 130b, so that the carrier support module 120 and the carrier assemblies 130a, b are arranged in a one-to-two relationship within the modular frame 110. Thus, the carrier support module 120, the carrier assemblies 130a, b, the carrier loading station 140, and the polishing station 150 are arranged in a one-to-two-to-one-to-one relationship within the modular frame 110. In some embodiments, the carrier support module 120 supports only a single carrier assembly, such as the first carrier assembly 130a. In some embodiments, the carrier support module 120 supports not more than two carrier assemblies, such as the first carrier assembly 130a and the second carrier assembly 130b. In some embodiments, a carrier support module 120 is configured to support not more and not less than the two carrier assemblies 130a, b.

Typically, each of the carrier assemblies 130a, b comprises a carrier head 131, a carrier shaft 132 coupled to the carrier head 131, one or a plurality of actuators, such as a first actuator 133 and a second actuator 134, and a pneumatic assembly 135. Here, the first actuator 133 is coupled to the carrier shaft 132 and is used to rotate the carrier shaft 132 about a respective carrier axis B or B'. The second actuator 134 is coupled to the first actuator 133 and is used to oscillate the carrier shaft 132 a distance $X(1)$ between a first position with respect to the carrier platform 121 and a second position disposed radially outward from the first position or to positions disposed therebetween. Typically, the carrier shaft 132 is oscillated during substrate polishing to sweep the carrier head 131, and thus a substrate 180 disposed therein, between an inner diameter of a polishing pad 152 and an outer diameter of the polishing pad 152 to, at least in part, prevent uneven wear of the polishing pad 152. Beneficially, the linear (sweeping) motion imparted to the carrier head 131 by oscillating the carrier shaft 132 may also be used to position the carrier head 131 on the polishing pad 152 such that the carrier head 131 does not interfere with the positioning of the polishing fluid dispense arm 153 and/or pad conditioning arm 155 (FIG. 1B). In some embodiments, the linear motion is used to retract the carrier heads 131 towards axis A before the carrier platform 121 is rotated or pivoted. Retracting the carrier heads 131 towards axis A provides a smaller swing radius as the carrier heads 131 are swung about the axis A between the carrier loading station 140 and the polishing station 150. This smaller swing radius advantageously makes room for the addition of other components to the polishing module 100 if additional components are so desired. In some embodiments, the distance $X(1)$ is between about 5 mm and about 50 mm.

The carrier shafts 132 are disposed through the respective openings 124 (FIG. 1B), here radial slots, disposed through the carrier platform 123. Typically, the actuators 133 and 134 are disposed above the carrier platform 123 and are enclosed within the region defined by the carrier platform 123 and the housing 125. The respective positions of the openings 124 in the carrier platform 123 and the position of the carrier shafts 132 disposed through the openings 124 determines a swing radius $R(1)$ of a carrier head 131 as it is moved from a substrate polishing to a substrate loading or unloading position. The swing radius R(1) of a carrier head 131 can determine minimum spacing between polishing modules 100a in the modular polishing systems described herein as well as the ability to perform processes in within a processing module that are ex-situ to the polishing process, i.e., not conducted concurrently therewith.

In some embodiments, the swing radius R(1) of a carrier head 131 is not more than about 2.5 times the diameter of a to-be-polished substrate, such as not more than about 2 times the diameter of a to-be-polished substrate, such as not more than about 1.5 times the diameter of a to-be-polished substrate. For example, for a polishing module 100a configured to polish a 300 mm diameter substrate the swing radius R(1) of the carrier head 131 may be about 750 mm or less, such as about 600 mm or less, or about 450 mm or less. Appropriate scaling may be used for polishing modules configured to polish other sized substrates. The swing radius R(1) of a carrier head 131 may be more, less, or the same as a swing radius R(2) of the carrier platform 123. For example, in some embodiments the swing radius R(1) of the carrier head 131 is equal to or less than the swing radius R(2) of the carrier platform 123.

Here, each carrier head 131 is fluidly coupled to a pneumatic assembly 135 through one or more conduits (not shown) disposed through the carrier shaft 132. The term "fluidly coupled" as used herein refers to two or more elements that are directly or indirectly connected such that the two or more elements are in fluid communication, i.e., such that a fluid may directly or indirectly flow therebetween. Typically, the pneumatic assembly 135 is fluidly coupled to the carrier shaft 132 using a rotary union (not shown) which allows the pneumatic assembly 135 to remain in a stationary position relative to the carrier platform 123 while the carrier head 131 rotates therebeneath. The pneumatic assembly 135 provides pressurized gases and/or vacuum to the carrier head 131, e.g., to one or more chambers (not shown) disposed within the carrier head 131. In other embodiments, one or more functions performed by components of the pneumatic assembly 135 as described herein may also be performed by electromechanical components, e.g., electromechanical actuators.

The carrier head 131 will often feature one or more of flexible components, such as bladders, diaphragms, or membrane layers (not shown) which may, along with other components of the carrier head 131, define chambers disposed therein. The flexible components of the carrier head 131 and the chambers defined therewith are useful for both substrate polishing and substrate loading and unloading operations. For example, a chamber defined by the one or more flexible components may be pressurized to urge a substrate disposed in the carrier head towards the polishing pad by pressing components of the carrier head against the backside of the substrate. When polishing is complete, or during substrate loading operations, a substrate may be vacuum chucked to the carrier head by applying a vacuum to the same or a different chamber to cause an upward deflection of a membrane layer in contact with the backside of the substrate. The upward deflection of the membrane layer will create a low pressure pocket between the membrane and the substrate, thus vacuum chucking the substrate to the carrier head 131. During substrate unloading operations, where the substrate is unloaded from the carrier head 131 into the carrier loading station 140, a pressurized gas may be introduced into the chamber. The pressurized gas in the chamber causes a downward deflection of the membrane to release a substrate from the carrier head 131a, b into the carrier loading station 140.

Here, the carrier loading station 140 is a load cup comprising a basin 141, a lift member 142 disposed in the basin 141, and an actuator 143 coupled to the lift member 142. In some embodiments, the carrier loading station 140 is coupled to a fluid source 144 which provides cleaning fluids, such as deionized water, which may be used to clean residual polishing fluids from a substrate 180 and/or carrier head 131 before and/or after substrate polishing. Typically, a substrate 180 is loaded into the carrier loading station 140 in a "face down" orientation, i.e., a device side down orientation. Thus, to minimize damage to the device side surface of the substrate through contact with surfaces of the lift member 142, the lift member 142 will often comprise an annular substrate contacting surface which supports the substrate 180 about the circumference, or about portions of the circumference, thereof. In other embodiments, the lift member 142 will comprise a plurality of lift pins arranged to contact a substrate 180 proximate to, or at, the outer circumference thereof. Once a substrate 180 is loaded into the carrier loading station 140 the actuator 143 is used to move the lift member 142, and thus the substrate 180, in the Z-direction towards a carrier head 131 positioned thereabove for vacuum chucking into the carrier head 131. The carrier head 131 is then moved to the polishing station 150 so that the substrate 180 may be polished thereon.

In other embodiments, the carrier loading station 140 features buff platen that may be used to buff, e.g., soft polish, the substrate surface before and/or after the substrate is processed at the polishing station. In some of those embodiments, the buff platen is movable in a vertical direction, i.e., the Z-direction to make room for substrate transfer to and from the carrier loading station using a substrate transfer and/or to facilitate substrate transfer to and from the carrier heads 131. In some embodiments, the carrier loading station 140 is further configured as an edge correction station, e.g., to remove material from regions proximate to the circumferential edge of the substrate before and/or after the substrate is processed at the polishing station 150. In some embodiment, the carrier loading station 140 is further configured as a metrology station and/or a defect inspection station, which may be used to measure the thickness of a material layer disposed on the substrate before and/or after polishing, to inspect the substrate after polishing to determine if a material layer has been cleared from the field surface thereof, and/or to inspect the substrate surface for defects before and/or after polishing. In those embodiments, the substrate may be returned to the polishing pad for the further polishing and/or directed to a different substrate processing module or station, such as a different polishing module 100 or to an LSP module 230 based on the measurement or surface inspection results obtained using the metrology and/or defect inspection station.

Here, a vertical line disposed through the center C of the carrier loading station 140 is co-linear with the center of a circular substrate 180 (e.g., a silicon wafer when viewed top down). As shown the center C is co-linear with the shaft axis B or B' when a substrate 180 is being loaded to or unloaded from a carrier head 131 disposed thereover. In other embodiments, the center C of the substrate 180 may be offset from the shaft axis B when the substrate 180 is disposed in the carrier head 131.

The polishing station 150 features a platen 151, a polishing pad 152, a polishing fluid dispense arm 153, an actuator 154 coupled to the fluid dispense arm 153, a pad conditioner arm 155, an actuator 156 coupled to a first end of the pad conditioner arm 155, and a pad conditioner 157. The pad conditioner 157 is coupled to a second end of the pad conditioner arm 155 that is distal from the first end. To reduce visual clutter the fluid dispense arm 153, the pad conditioner arm 155, the actuators 154, 156 respectively coupled thereto, and the pad conditioner 157 are not shown in FIG. 1A but are shown in FIG. 1B. In other embodiments, the fluid dispense arm 153 may be disposed in a fixed position relative to the rotational center of the polishing platen 151, i.e., disposed in a fixed position relative to the platen axis D. In some embodiments, the fluid dispense arm 153 may be curved so as to avoid interference with the carrier heads 131 as the carrier heads 131 are swung about the support shaft axis A.

Here, the polishing station 150 further includes a fence 158 (shown in cross section in FIG. 1A) which surrounds the polishing platen 102 and is spaced apart therefrom to define a drainage basin 159. Polishing fluid and polishing fluid byproducts are collected in the drainage basin 159 and are removed therefrom through a drain 160 in fluid communication therewith. In other embodiments, the fence 158 may comprise one or more sections disposed about, or partially disposed above, respective portions of the polishing platen 102, and/or may comprises one or more sections disposed between the carrier loading station 140 and the polishing station 150. Here, the platen 151 is rotatable about a platen axis D which extends vertically through the center of the platen 151. Here, the polishing station 150 features a single platen 151 so that the carrier support module 120, the carrier loading station 140, and the platen 151 are disposed in a one-to-one-to-one relationship.

Typically, the carrier support module 120 and the polishing station 150 are arranged to minimize the footprint of the polishing module 100a. For example, in one embodiment a distance X(2) between the support shaft axis A and the platen axis D is not more than 2.5 times the swing radius R(1) of a carrier head 131, such as not more than 2 times, not more than 1.5 times, or not more than 1.25 times the swing radius R(1) of a carrier head.

Here, the fluid dispense arm 153 is configured to dispense polishing fluids at or proximate to the center of the polishing pad, i.e., proximate to platen axis D disposed therethrough. The dispensed polishing fluid is distributed radially outward from the center of the platen 151 by centrifugal force imparted to the polishing fluid by the rotation of the platen 151. For example, here the actuator 154 is coupled to a first end of the fluid dispense arm 153 and is used to move the fluid dispense arm 153 about an axis E so that a second end of the fluid dispense arm 153 may be positioned over or proximate to the center of the platen 151 and the polishing pad 152 disposed thereon.

The pad conditioner arm 155 comprises a first end coupled to the actuator 156 and a second end coupled to the pad conditioner 157. The actuator 156 swings the pad conditioner 157 about an axis F disposed through the first end and simultaneously urges the pad conditioner 157 toward the surface of the polishing pad 152 disposed therebeneath. The pad conditioner 157 is typically one of a brush or a fixed abrasive conditioner, e.g., a diamond embedded disk, which is used to abrade and rejuvenate the polishing surface of the polishing pad 152.

Here, the pad conditioner 157 is urged against the polishing pad 152 while being swept back and forth from an outer diameter of the polishing pad 152 to, or proximate to, the center of the polishing pad 152 while the platen 151, and thus the polishing pad 152, rotate therebeneath. The pad conditioner 157 is used for in-situ conditioning, i.e., concurrent with substrate polishing, ex-situ conditioning, i.e., in periods between substrate polishing, or both. Typically, the pad conditioner 157 is urged against the polishing pad 152 in the presence of a fluid, such as polishing fluid or deionized water, which provides lubrication therebetween. The fluid is dispensed onto the polishing pad 152 near the platen axis D by positioning the fluid dispense arm 153 thereover. Typically, the carrier support module 120 and the polishing station 150 are arranged so that the swing radius R(1) of a carrier head 131 is not within a swing path of one or both of the fluid dispense arm 153 or the pad conditioner 157. This arrangement beneficially allows for ex-situ conditioning of the polishing pad 152 while the carrier support module 120 pivots the carrier heads 131 between the carrier loading and substrate polishing positions as further described below.

Typically, the carrier support module 120, the carrier assemblies 130a, b, the carrier loading station 140, and the polishing station 150 are disposed in an arrangement that desirably minimizes the cleanroom footprint of the polishing module 100a. Herein, a description of the arrangement is made using the relative positions of the carrier heads 131, carrier loading station 140, and platen 151 when the carrier support module 120 is disposed in one of a first or second processing mode and the first and second planes G and G' defined therefrom (plane G is shown in FIGS. 1B and 1C, plane G' is shown in FIG. 1C).

In FIGS. 1A-1B, the carrier support module 120 is disposed in a first processing mode. In the first processing mode the first carrier assembly 130a is disposed above the platen 151 and the second carrier assembly 130b is disposed above the carrier loading station 140. I.e., in the first processing mode the carrier head 131 of the second carrier assembly 130b is positioned above the carrier loading station 140 to allow for substrate loading and unloading thereinto and therefrom. In a second processing mode (not shown) the carrier platform 123 will be rotated or pivoted an angle θ of 180° about the support shaft axis A and the relative positions of the first carrier assembly 130a and the second carrier assembly 130b will be reversed. I.e., in the second processing mode the carrier head 131 of the second carrier assembly 130a will be positioned above the carrier loading station 140 to allow for substrate loading and unloading thereinto and therefrom.

Herein, the relative positions of the carrier support module 120 and the polishing station 150 are described by reference to the first and second planes G and G' shown in FIGS. 1B and 1C. The first plane G is a vertical plane that is orthogonal to the typically horizontal pad mounting surface of the platen 151 and is further defined by the support shaft axis A and a vertical center C of the carrier loading station 140. Typically, the carrier shaft axes B and B' will be disposed within the first plane G when the carrier support module 120 is disposed in either the first or second processing modes. As shown in FIG. 1B, the support shaft axis A, the vertical center C, and the platen axis D are co-planar with one another and thus collectively define the first plane G.

In other embodiments, the platen axis D is offset from the first plane G so as to form a second plane G' with the support shaft axis A. The second plane G' is schematically represented in FIG. 1C. In those embodiments, the first plane G and the second plane G' will typically form an angle θ(2) of 45° or more, such as 60° more, 75° or more, 90° or more, for example 95° or more when the carrier support module 120 is disposed in either of the first or second processing modes.

Beneficially, the polishing module 100a described in FIGS. 1A-1C, including alternate embodiments thereof and combinations of alternate embodiments thereof, may be independently manufactured for later integration into a high throughput density customizable modular polishing system. Examples of customizable modular polishing systems which may be formed using the polishing module 100a are provided in FIGS. 2-7.

Figure 2A:
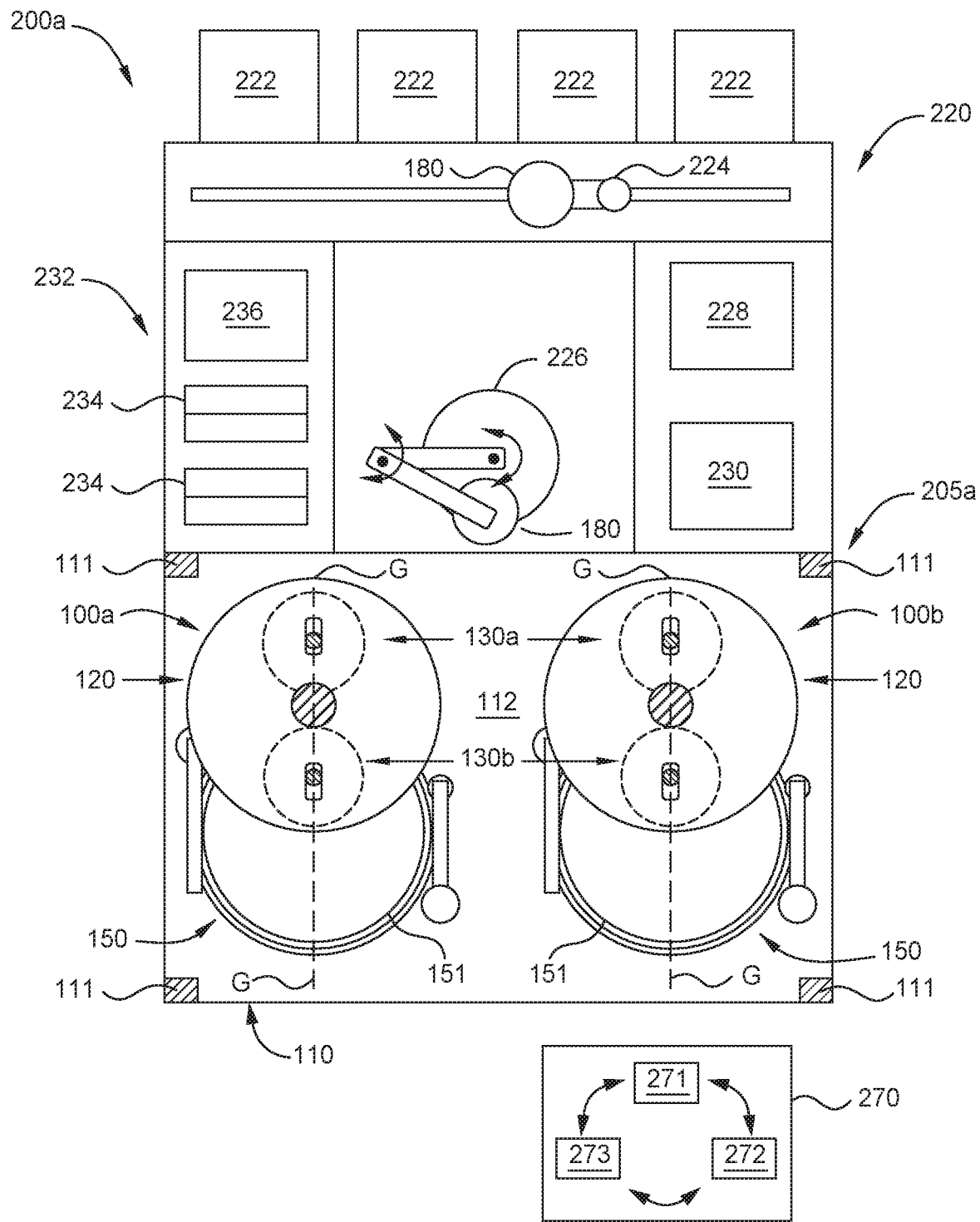
FIG. 2A-2B is a schematic top down sectional views of various embodiments of modular polishing systems each comprising a plurality of the polishing modules set forth in FIGS. 1A-1B.

FIG. 2A is a schematic top down sectional view of a modular polishing system comprising a plurality of the polishing modules set forth in FIGS. 1A-1C, according to one embodiment. Here, the modular polishing system 200a features a first portion 220 and a second portion 205a coupled to the first portion 220. The second portion 205a includes two polishing modules 100 a, b which share a frame 110 including upright supports 111, a shared tabletop 112, and a shared overhead support 113. In other embodiments, each of the polishing modules 100 a, b respectively comprise individual frames 110 (such as shown in FIGS. 1A-1B) which are coupled together to form the second portion 205a.

Each of the polishing modules 100a, b feature a carrier support module 120, a carrier loading station 140, and a polishing station 150 disposed in a one-to-one-to-one relationship as shown and described in FIGS. 1A-1C. Each of the polishing stations 150 of the respective polishing modules 100a, b features a single platen 151 so that each of the respective polishing modules 100a, b comprise a carrier support module 120, a carrier loading station 140, and a platen 151 disposed in a one-to-one-to-one relationship as shown and described in FIGS. 1A-1C.

Typically, the polishing module 100b is substantially similar to an embodiment of the polishing module 100a described in FIGS. 1A-1C, and may include alternate embodiments, or combinations of alternate embodiments, thereof. For example, in some embodiments, one of the two polishing modules, e.g., polishing module 100a, is configured to support a longer material removal polishing process while the other polishing module, e.g., 100b is configured to support a shorter post-material removal buffing process. In those embodiments, substrates processed on polishing modules 100a are then transferred to polishing module 100b. Often, the shorter post-material removal buffing process will be a throughput limiting process which will benefit from the throughput increasing two carrier assembly 130a, b arrangement described in FIGS. 1A-1C. Thus, in some embodiments, one or more substrate polishing modules within a modular polishing system may comprise a single carrier assembly 130a or 130b while other polishing modules within the modular polishing system comprise two carrier assemblies 130a and 130b.

Here, the polishing modules 100a, b are disposed in a side-by-side arrangement where the first planes G thereof are generally parallel or substantially parallel with one another, such as within 30° of parallel with one another, within 20° of parallel with one another, or within 10° or parallel with one another. Here, each of the polishing modules 100a, b "faces toward" the first portion 220. As used herein, a polishing module "faces towards" a component or a portion of the modular polishing system 200a when the carrier support module 120 and the carrier loading station 140 are closer to that component or portion and the polishing station 150 is farther away. For example, in FIG. 2A the carrier support modules 120 and the carrier loading stations 140 (shown in FIG. 1A) of the polishing modules 100a, b are closer to the first portion 220 than are the polishing stations 150.

Figure 2B:
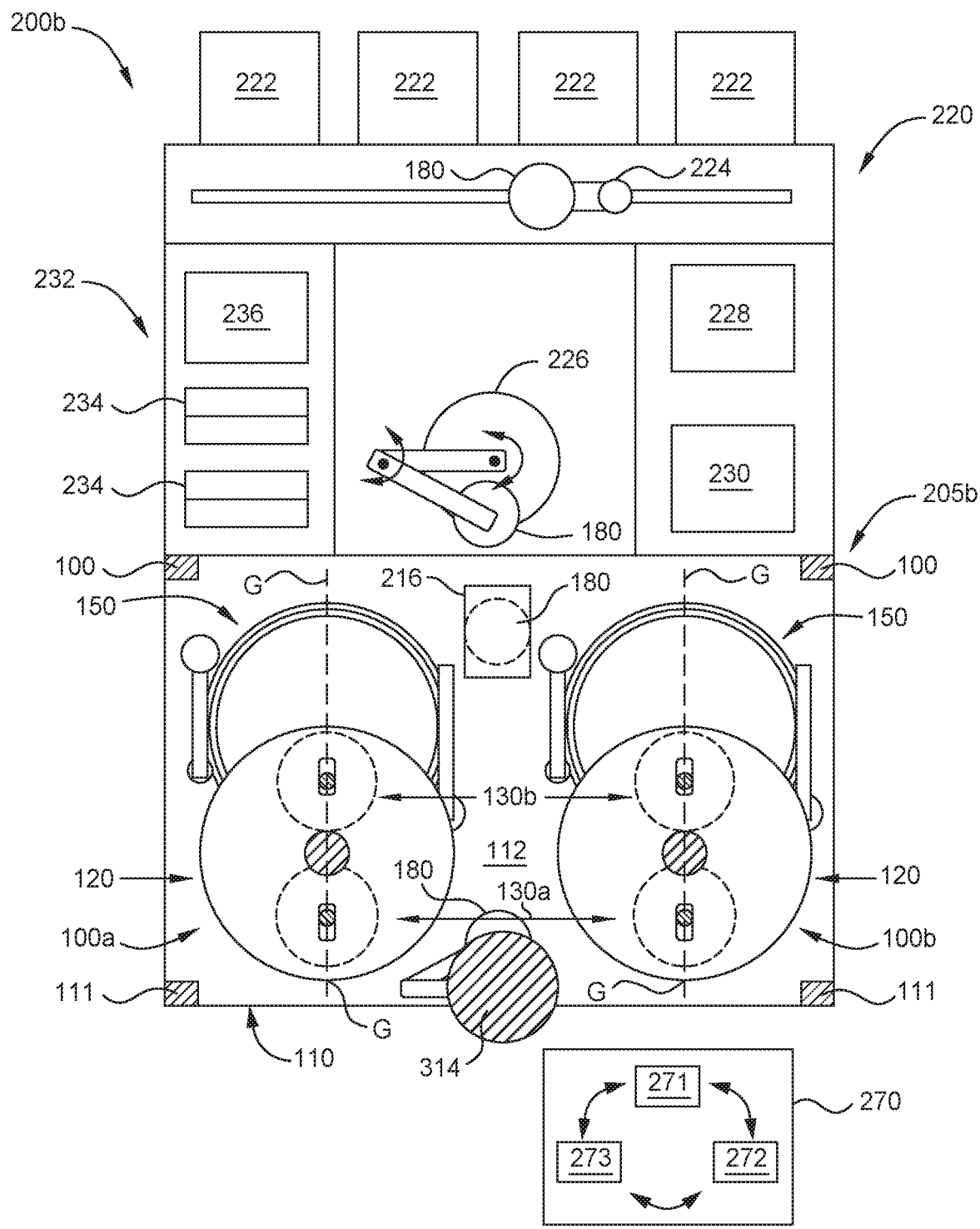

In another embodiment, such as shown in FIG. 2B, in second portion 205B, the polishing modules 100 a, b are oriented to "face away" from the first portion 220. As used herein, a polishing module "faces away" from a component or a portion of a modular polishing system when the polishing station 150 is closer to the component or portion and the carrier support module 120 is farther away. In some embodiments where the polishing modules 100 a, b are oriented to face away from the first portion it may be desirable to use a third robot 314 to facilitate substrate handling. In this embodiment substrates 180 from the first portion 220 are loaded into the transfer station 216 by the second robot 226. The substrates 180 are then picked up from the transfer station 216 by the third robot 314 to be moved to one of the carrier loading stations 140.

Typically, the first portion 220 comprises one or combination of a plurality of system loading stations 222, one or more substrate handlers, e.g., a first robot 224 and a second robot 226, one or more metrology stations 228, one or more location specific polishing (LSP) module 230, and one or more one or more post-CMP cleaning systems 232. An LSP module 230 is typically configured to polish only a portion of a substrate surface using a polishing member (not shown) that has a surface area that is less than the surface area of a to-be-polished substrate. LSP modules 230 are often used after a substrate has been polished within a polishing module to touch up, e.g., remove additional material, from a relatively small portion of the substrate. In some embodiments one or more LSP modules 230 may be included within the second portion 205 in place of one of the polishing modules 100a, b.

In other embodiments the one or more LSP modules 230 may be disposed in any other desired arrangement within the modular polishing systems set forth herein. For example, one or more LSP modules 230 may be disposed between the first portion 220 and the second portion 205, between adjacently disposed polishing modules 100a-i in any of the arrangements described herein, and/or proximate to an end of any of the second portions described herein, the end of the respective second portion being distal from the first portion. In some embodiments, the modular polishing systems may include one or more buffing modules (not shown) which may be disposed in any of the arrangements described above for the LSP module 230. In some embodiments, the first portion 220 features at least two post-CMP cleaning systems 232 which may be disposed on opposite sides of the second robot 226.

A post-CMP cleaning system facilitates removal of residual polishing fluids and polishing byproducts from the substrate 180 and may include any one or combination of brush or spray boxes 234 and a drying unit 236. The first and second robots 224, 226 are used in combination to transfer substrates 180 between the second portion 205 and the first portion 220 including between the various modules, stations, and systems thereof. For example, here, the second robot 226 is at least used to transfer substrates to and from the carrier loading stations 140 of the respective polishing modules 100a, b and/or therebetween.

In embodiments herein, operation of the modular polishing system 200 is directed by a system controller 270. The system controller 270 includes a programmable central processing unit (CPU) 271 which is operable with a memory 272 (e.g., non-volatile memory) and support circuits 273. The support circuits 273 are conventionally coupled to the CPU 271 and comprise cache, clock circuits, input/output subsystems, power supplies, and the like, and combinations thereof coupled to the various components of the modular polishing system 200, to facilitate control thereof. The CPU 271 is one of any form of general purpose computer processor used in an industrial setting, such as a programmable logic controller (PLC), for controlling various components and sub-processors of the processing system. The memory 272, coupled to the CPU 271, is non-transitory and is typically one or more of readily available memories such as random access memory (RAM), read only memory (ROM), floppy disk drive, hard disk, or any other form of digital storage, local or remote.

Typically, the memory 272 is in the form of a non-transitory computer-readable storage media containing instructions (e.g., non-volatile memory), which when executed by the CPU 271, facilitates the operation of the modular polishing system 200. The instructions in the memory 272 are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Illustrative non-transitory computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory devices, e.g., solid state drives (SSD) on which information may be permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the methods set forth herein, or portions thereof, are performed by one or more application specific integrated circuits (ASICs), field-programmable gate arrays (FPGAs), or other types of hardware implementations. In some other embodiments, the substrate processing and/or handling methods set forth herein are performed by a combination of software routines, ASIC(s), FPGAs and, or, other types of hardware implementations. One or more system controllers 270 may be used with one or any combination of the various modular polishing systems described herein and/or with the individual polishing modules thereof.

FIG. 3A is a schematic top down sectional view of a modular polishing system comprising a plurality of polishing modules disposed in an alternate arrangement, according to one embodiment. FIG. 3B is a schematic representation of an inter-module substrate exchanger 350 which may be used with any one or combination of the modular polishing systems described herein. The modular polishing system 300 features a first portion 320 and a second portion 305 coupled to the first portion 320. The first portion 320 may be substantially the same as the first portion 220 described in FIG. 2 including any one or combination of the features or alternate embodiments thereof.

Here, the second portion 305 features four polishing modules 100*a-d*, a third robot 314 suspended from an overhead support (such as the overhead support 113 described in FIG. 1) and a transfer station 216. The polishing modules 100*c, d* are disposed in a side-by-side arrangement facing away from the first portion 320. For example, in FIG. 3 the polishing stations 150 of each of the respective polishing modules 100*c, d* are closer to the first portion 320 than are the carrier support modules 120 and the carrier loading stations 140.

Here, the polishing modules 100*c, d* share a frame 110 such as described above in FIG. 2*a* with respect to polishing modules 100*a, b*. In some embodiments, each of the individual polishing modules is disposed within a corresponding frame in a one-to-one arrangement and the individual frames are coupled together to form the second portions described in any of the modular polishing systems set forth herein. In other embodiments, a single frame may be used to support two or more polishing modules, three or more, four or more, five or more, or six or more polishing modules. In some embodiments, individual frames each supporting a different number of polishing modules may be coupled together to form any one or combination of the modular polishing systems set forth herein. For example, an individual frame supporting two polishing modules may be coupled with two individual frames each supporting a single polishing module, with another individual frame supporting two modules, and/or with an individual frame supporting four or more polishing modules to achieve a desired polishing system configuration.

In this embodiment, the polishing modules 100*a, b* are spaced apart from the first portion 320 by the polishing modules 100*c, d*. The polishing modules 100*a, b* are disposed in a side-by-side arrangement each facing towards the polishing modules 100*c, d* to define a substrate transfer region therebetween. The third robot 314 is disposed in the substrate transfer region to facilitate access to the carrier loading stations 140 (as shown in FIG. 1A) for each of the polishing modules 100*a-d*. The transfer station 216 is disposed in an area between the second robot 226 and the third robot 314.

Typically, substrates 180 from the first portion 320 are loaded into the transfer station 216 by the second robot 226. The substrates 180 are then picked up from the transfer station 216 by the third robot 314 to be moved to one of the carrier loading stations 140. In some embodiments, one or more of the polishing modules 100*a-d* are configured for different polishing processes, such as the material removal and post-material buffing processes described in FIG. 2A. In those embodiments, the third robot 314 may be used to transfer the substrates 180 between the polishing modules 100*a-d* before transferring the substrate 180 back to the transfer station 216 for pick up by the second robot 226.

Here, the polishing modules 100*c, d* are disposed in an arrangement where the first planes G thereof are generally parallel with one another, such as described above with respect to the arrangement between polishing modules 100*a, b*. Each of the polishing modules 100*c, d* feature a carrier support module 120, a carrier loading station 140, and a polishing station 150 disposed in a one-to-one-to-one relationship. Each of the polishing stations 150 of the respective polishing modules 100*c, d* feature a single platen 151 so that each of the respective polishing modules 100*c, d* comprises a carrier support module 120, a carrier loading station 140, and a polishing platen disposed in a one-to-one-to-one relationship. Typically, the polishing modules 100*c, d* are substantially similar to the polishing modules 100*a, b* as described above, including alternate embodiments, or combinations of alternate embodiments, of the features thereof. In some embodiments one or more LSP systems 230 may be included within the second portion 305 in place of one or more of the polishing modules 100*a-d*.

In some embodiments, the modular polishing systems described herein further include a substrate exchanger dedicated to moving substrates between polishing and/or other substrate processing modules, such as the inter-module substrate exchangers 350 shown in FIGS. 3A-3B. In FIG.

3A, the inter-module substrate exchangers 350 are disposed between adjacent polishing modules, e.g., between the polishing modules 100a and 100c and between the polishing modules 100b and 100d. In some embodiments, one or more inter-module substrate exchangers 350 may be used to facilitate a relatively quick substrate transfer between a polishing modules 100 and different type of substrate processing module, such as an LSP module 230 or a buffing module (not shown). In those embodiments, the respective inter-module substrate exchanger 350 is disposed between the polishing module 100 and the different type of substrate processing module positioned adjacent to the polishing module 100.

In FIG. 3B, the inter-module substrate exchanger 350 is disposed between the carrier loading stations 140 of two adjacent polishing modules, e.g., the polishing modules 100a and c shown in FIG. 3A. Here, the inter-module substrate exchanger 350 features a pivot arm 352, an actuator 354, and an end-effector 356. The actuator 354 is coupled to a first end of the pivot arm 352 and the end-effector 356 is coupled to a second end of the pivot arm 352. The actuator 354 is used to swing the end-effector 356, and thus a substrate 180 disposed thereon, about an axis H. Typically, the end-effector 356 is coupled to a vacuum (not shown) which may be used to securely hold the substrate 180 to the end-effector 356 as the substrate 180 is moved between the carrier loading stations 140.

In some embodiments, the actuator 354 may be movable in the Z-direction to further facilitate substrate handling. The inter-module substrate exchanger 350 beneficially provides for a higher substrate processing throughput by facilitating inter-module substrate transfer, e.g., in a multi-platen polishing processes, without adding to the burden on the other substrate handlers (robots) and/or without the added delay of waiting for a substrate handler to be free. In other words, the inter-module substrate exchangers 350 may be used to improve the overall substrate processing throughput of the modular polishing systems described herein by reducing the number of sequential moves that would otherwise need to be performed by the other substrate handlers (robots).

Figure 4:
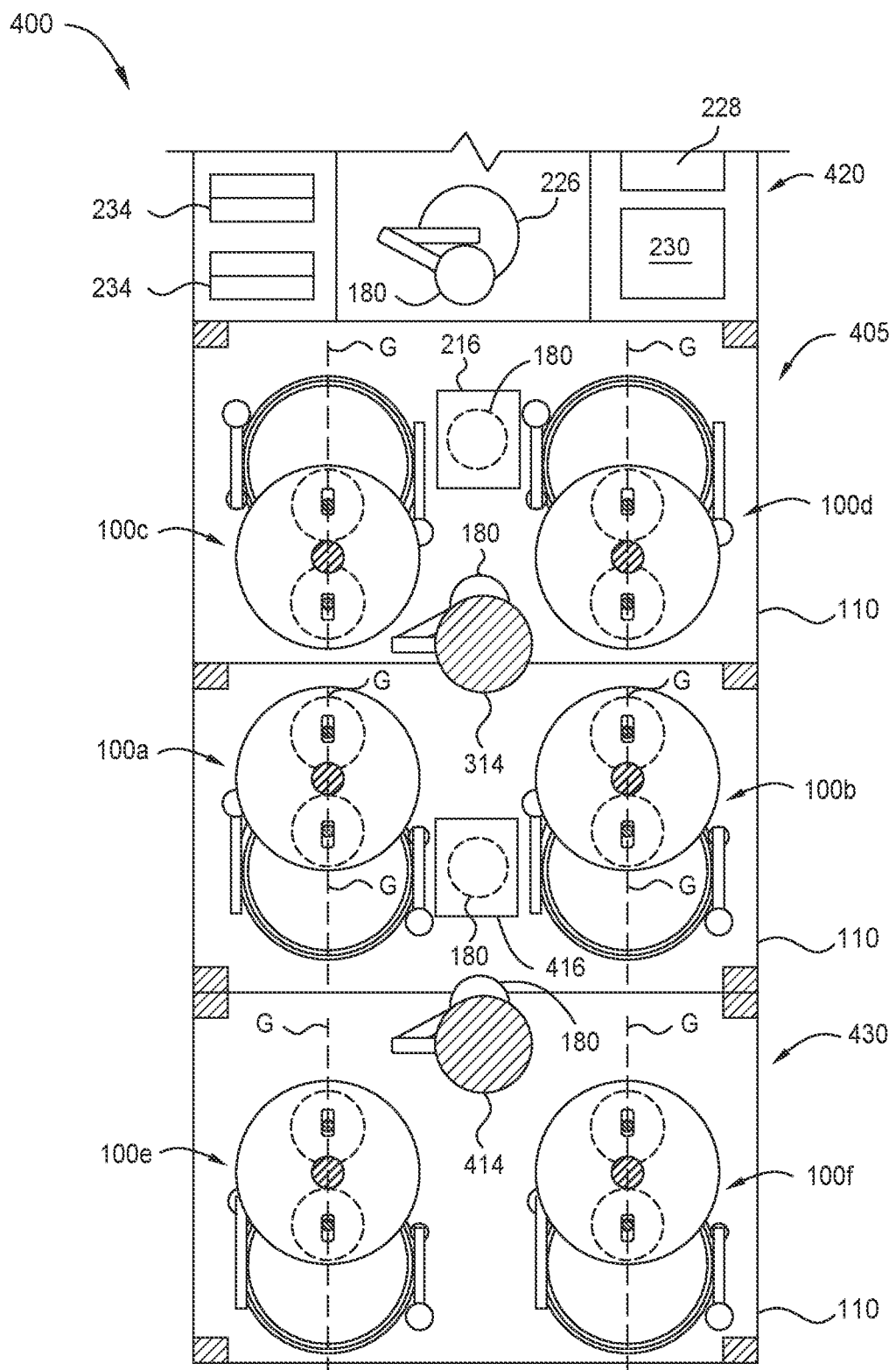
FIG. 4 is a schematic top down sectional view of a modular polishing system comprising a plurality of the polishing modules, such as set forth in FIGS. 1A-1B, according to another embodiment.

FIG. 4 is a schematic top down sectional view of a modular polishing system comprising a plurality of polishing modules disposed in an alternate arrangement, according to one embodiment. The modular polishing system 400 features a first portion 420 coupled to a second portion 405. The first portion 420 may be substantially the same as the first portions 220, 320 respectively described in FIGS. 2-3 above, including any one or combination of the features or alternate embodiments thereof.

Here, the second portion 405 features polishing modules 100a-f, the third robot 314, the transfer station 216 (hereafter the first transfer station 216), a fourth robot 414 suspended from an overhead support (such as the overhead support 113 described in FIG. 1A), and a second transfer station 416. Here, the polishing modules 100a-d, the first transfer station 216, and the third robot 314 are disposed in the arrangement shown and described in FIG. 3. The polishing modules 100e, f share a frame 110 such as described above with respect to polishing modules 100a, b which is coupled to the frame 110 of the polishing modules 100a, b. The polishing modules 100e, f are disposed in an arrangement where the first planes G thereof are generally parallel with one another, such as described above with respect to the arrangement between polishing modules 100a, b. The polishing modules 100e, f respectively face towards polishing modules 100a, b. The fourth robot 414 is disposed in a region defined by the polishing modules 100a, b and the polishing modules 100e, f. The second transfer station 416 is disposed between the third robot 314 and the fourth robot 414.

Figure 5A:
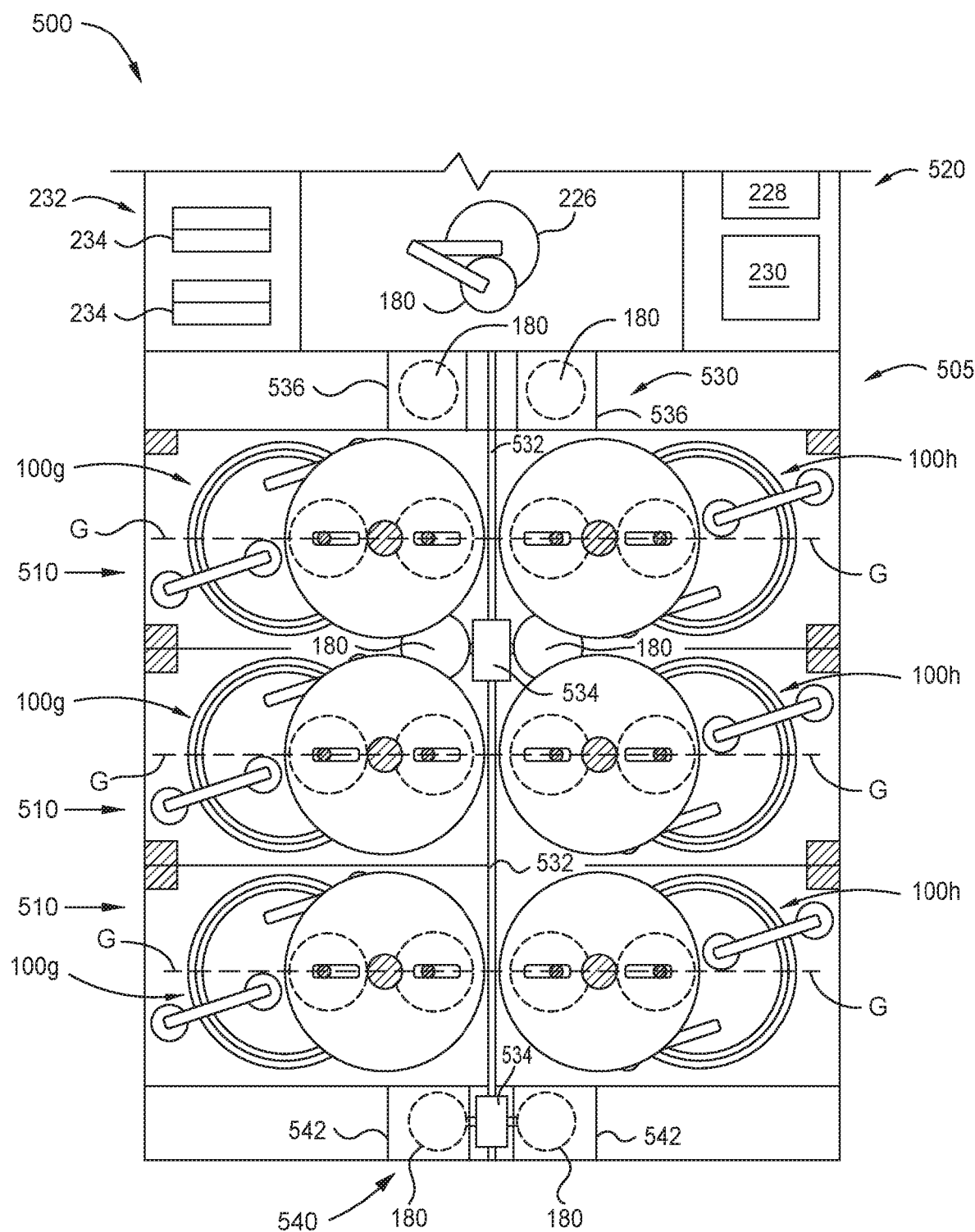
FIG. 5A is a schematic top down view of a modular polishing system, according to another embodiment.
Figure 5B:
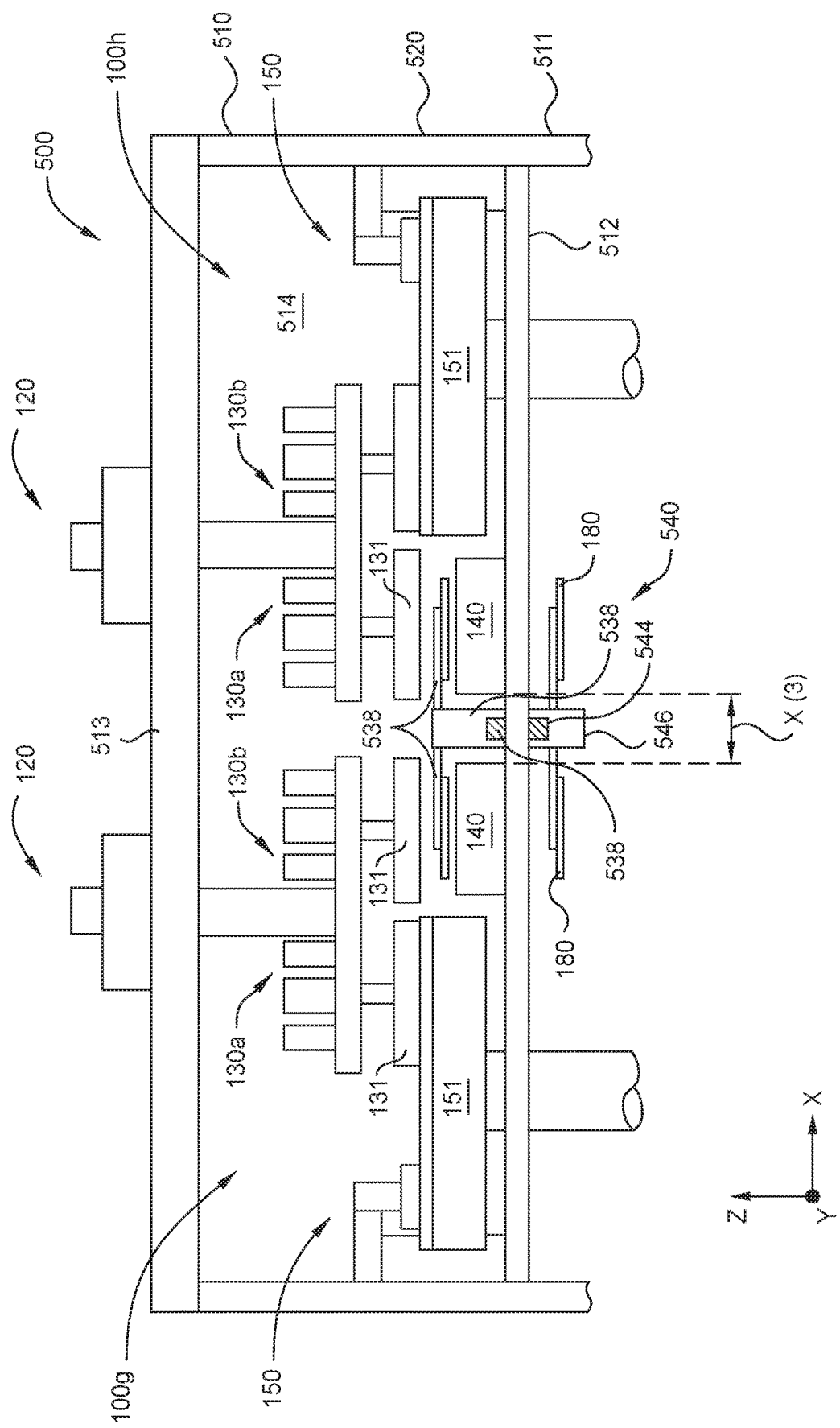
FIG. 5B is a side view of a portion of the modular polishing system shown in FIG. 5A.

FIG. 5A is a schematic top down view of modular polishing system, according to another embodiment. FIG. 5B is a side view of a portion of the modular polishing system shown in FIG. 5A. Here, the modular polishing system 500 features a second portion 505 coupled to a first portion 520 and a linear substrate handling system 530. The linear substrate handling system 530 facilitates high throughput substrate handling in the second portion 505. The first portion 520 may be substantially the same as any one of the first portions 220, 320, 420 described in FIGS. 2-4 respectively, including any one or combination of the features or alternate embodiments of the features thereof.

The second portion 505 features a plurality of modular frames 510 (shown and labeled in FIG. 5B) each comprising a pair of polishing modules 100g, h. Each modular frame 510 features a plurality of upright supports 511, a horizontally disposed tabletop 512, and an overhead support 513 (shown in FIG. 5B) disposed above the tabletop 512 and spaced apart therefrom. The upright supports 511, the tabletop 512, and the overhead support 513 collectively define a processing region 514.

Here, each of the polishing modules 100g, h features a carrier support module 120, a carrier loading station 140, and a polishing station 150 disposed in a one-to-one-to-one relationship. Each of the polishing stations 150 of the respective polishing modules 100g, h features a single platen 151 so that each of the respective polishing modules 100g, h comprises a carrier support module 120, a carrier loading station 140, and a platen 151 disposed in a one-to-one-to-one relationship. Typically, the polishing modules 100g, h are substantially similar to the polishing modules 100a-f as described above, including alternate embodiments, or combinations of alternate embodiments, of the features thereof.

Here, each of the polishing modules 100g, h within a pair are arranged so that they face towards one another within the processing region 514 in order to facilitate substrate handling using the linear substrate handling system 530. As shown, each of the polishing modules 100g, h within a modular frame 510 are aligned with one another so that a plane G of the polishing module 100g is substantially coplanar with a plane G of the polishing module 100h. In other embodiments, the polishing modules 100g, h of a pair may be offset from one another so that the planes G of the polishing modules are parallel or substantially parallel, for example within about 10° of parallel.

Here, the linear substrate handling system 530 features a linear member 532, e.g., such as a track, rail, or belt, and one or more shuttles 534 moveably disposed on or coupled to the linear member 532. The linear member 532 extends from a first end of the second portion 505 to a location proximate to the second end of the second portion 505 which is opposite of the first end. Here, the first end is proximate to the first portion 520. Typically, the linear substrate handling system 530 further includes one or more substrate transfer stations 536 disposed in an area between the second robot 226 and the second portion 505 to facilitate transfer of the substrates 180 from the first portion 520 to the shuttles 534. Here, a shuttle 534 comprises one or more arms 538 (shown in FIG. 5B) used for retrieving substrates from the transfer stations 536.

Once one or more substrates 180 are retrieved from the transfer stations 536 the shuttle 534 moves along the linear member 532 to position each of the substrates 180 in a desired carrier loading station 140 of a polishing module 100g, h. In some embodiments, at least a portion of the substrates 180 will pass between the carrier loading stations 140 and the respective carrier heads 131 positioned thereabove as the substrates 180 are moved to a desired carrier loading station 140. This configuration beneficially allows for relatively closer spacing between the polishing modules 100g, h than in a modular system using one or more fixed position robots. For example, in some embodiments a distance X(3) between the carrier loading stations 140 of a pair of polishing modules 100g, h is not more than 8 times the diameter of a to-be-polished substrate, such as 7 times or less, 6 times or less, example less than 5 times the diameter of a to-be-polished substrate. In some embodiments, the spacing between the support shaft axes A of a pair of polishing modules 100g, h is not more than 5 times the diameter of a to-be-polished substrate. For example, for a modular polishing system configured to polishing 300 mm substrate the spacing between the support shaft axes A of a pair of polishing modules 100g, h is not more than 1500 mm.

In some embodiments, the linear substrate handling system 530 further includes a substrate return path 540 (shown in part in FIG. 5B) disposed beneath the tabletop 512. The substrate return path 540 includes or more assemblies, such as one or more elevators 542, disposed proximate to the second end of the second portion 505, a second linear member 544, such as a track, rail, or belt disposed beneath the tabletop 512, and a second shuttle 546 disposed on or coupled to the linear member 544. Typically, once a substrate 180 has completed processing in the second portion 505 a first shuttle 534 will retrieve the substrate 180 from a carrier loading station 140 and transfer the substrate to an elevator 542. The elevator 542 will move the substrates 180 to a region below the tabletop 512, where a second shuttle 546 will move the substrate 180 from the elevator 542 to a transfer station (not shown) disposed proximate to the first portion 520 of the processing system where it may be retrieved by the second robot 226 for post-CMP processing therein.

Figure 6:
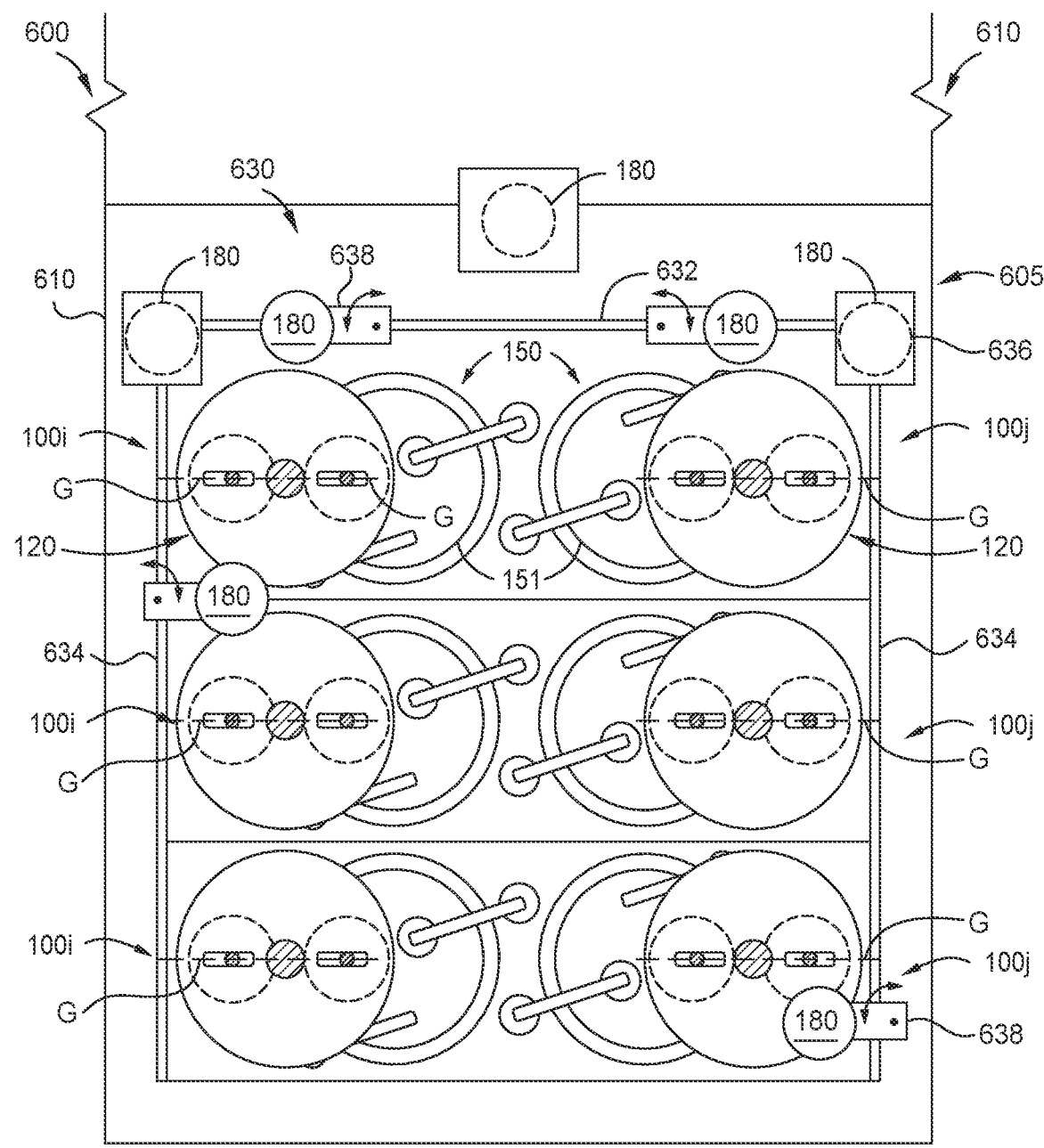
FIG. 6 is a schematic top down sectional view of a modular polishing system, according to another embodiment.
Figure 7:
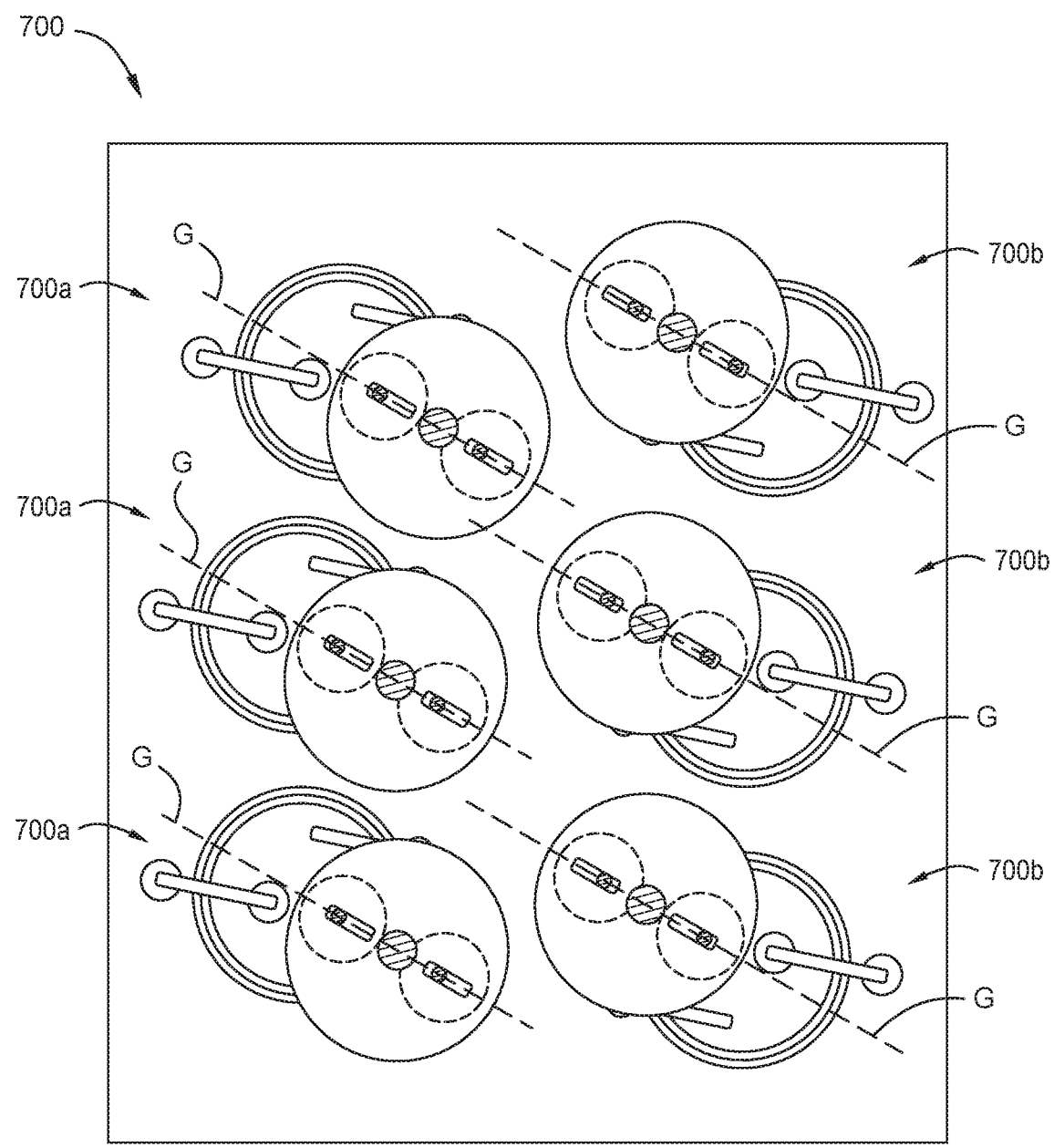
FIG. 7 is a schematic top down section view illustrating an alternate arrangement of polishing modules, according to one embodiment.

FIG. 6 is schematic top down view of another embodiment of a modular polishing system. Here, the modular polishing system 600 features a second portion 605, a first portion 620 coupled to the second portion 605, and a linear transfer system 630. The second portion 605 features a plurality of polishing modules 100i, j arranged in pairs 610. Each of the polishing modules 100i, j feature a carrier support module 120, a carrier loading station 140 (not shown), and a polishing station 150 arranged in a one-to-one-to-one relationship. Each of the polishing stations 150 of the respective polishing modules 100i, j feature a single platen 151 so that each of the respective polishing modules 100i, j comprises a carrier support module 120, a carrier loading station 140, and a platen 151 disposed in a one-to-one-to-one relationship. Here, the polishing modules 100i, j within a pair 610 are arranged to face away from one another so that the respective carrier loading stations 140 thereof are disposed proximate to an outer perimeter of the second portion 605. Typically, the polishing modules 100i, j are substantially similar to the polishing modules 100a-h as described above, including alternate embodiments, or combinations of alternate embodiments, thereof.

The linear transfer system 630 features a first linear member 632, a plurality of second linear members 634 orthogonally disposed to the first linear member 632, a plurality of transfer stations 636, and a plurality of shuttles 638. Examples of suitable linear members 632, 634 include tracks, rails, belts, or combination thereof. The shuttles 638 may be movably disposed on the linear member 632, 634 or coupled thereto. Here, one or more of the shuttles 638 comprises a pivot arm. The first linear member 632 is disposed between the polishing modules 100i, j and the first portion 620. The second linear members 634 are respectively disposed between the perimeter of the second portion 605 and the carrier loading stations 140.

In FIGS. 2-6 the modular polishing systems are shown with an even number of polishing modules generally arranged so that the planes G are parallel with or orthogonal to the first end of the second portions thereof. In other embodiments, the modular polishing systems may comprise an odd number of polishing modules, e.g., 1, 2, 3, 5, or more. In some other embodiments, which may be combined with any one or combination of the modular polishing systems described herein the polishing modules are arranged so that the planes G are not generally parallel or orthogonal to the first end of the second portions of the polishing module. For example, in the modular polishing system 700 shown in FIG. 7, polishing modules 700a, b are disposed so that the planes G are between 20° and 70° of from parallel to a first end of the modular polishing system 700. The polishing modules 700a, b may be substantially similar to the polishing modules 100a-j described above, including any combination or alternative embodiments of the features thereof.

Figure 8A:
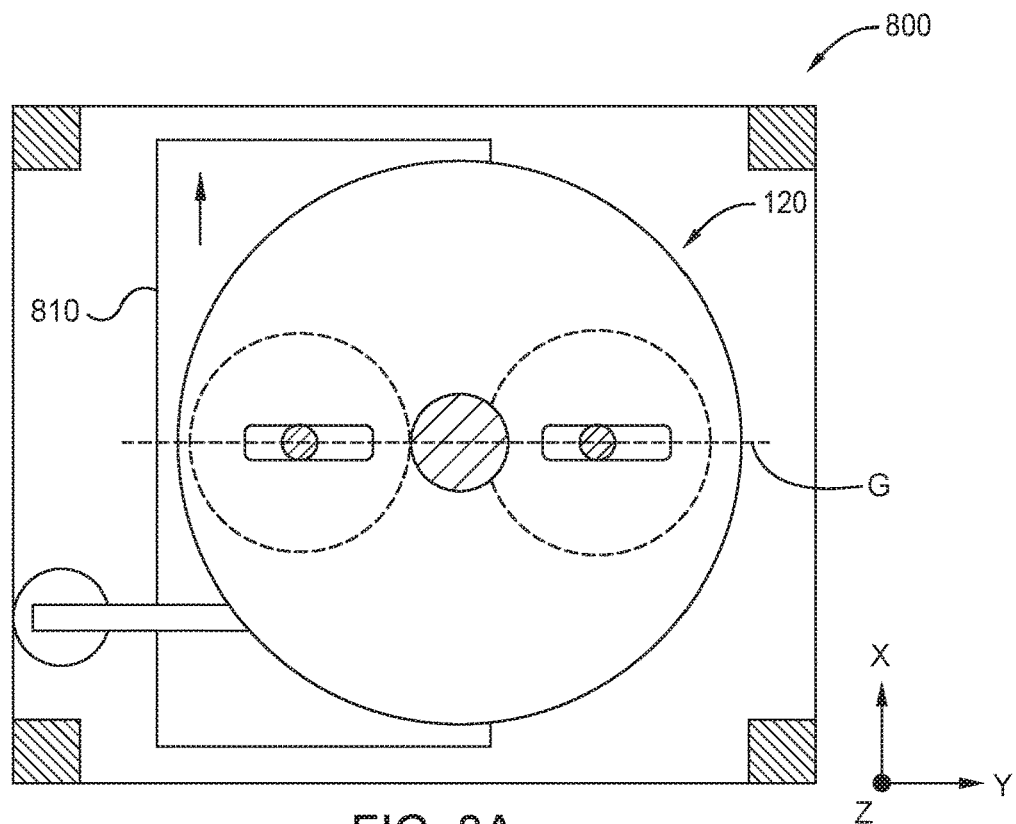
FIG. 8A is a schematic top down sectional view of an alternate embodiment of a polishing module which may be used with any one or combination of the polishing systems set forth in FIGS. 2-7.

The polishing modules described in FIGS. 1A-1C and 2-7 above typically comprise polishing stations 150 having a rotatable platen 151 having a polishing pad 152 fixedly secured thereto. In other embodiments, one or more of the polishing modules of FIGS. 1A-1C and 2-7 may comprise a linear polishing platen, such as set forth in FIGS. 8A-8B and 9 below.

Figure 8B:
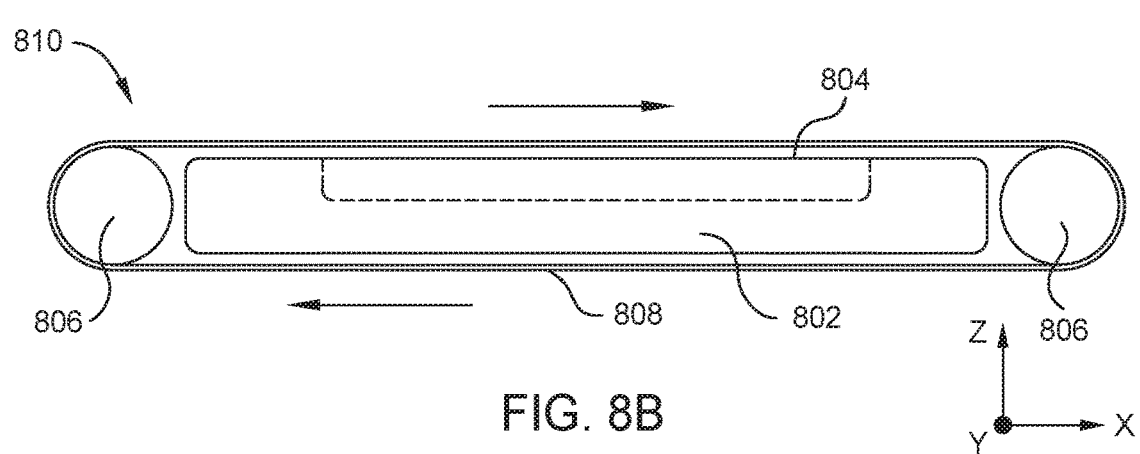
FIG. 8B is a schematic side view of the linear polishing station of FIG. 8B, according to one embodiment.

FIG. 8B is a schematic side view of the linear polishing station 810 of FIG. 8B. Here, the polishing module 800 features a polishing station 810 which may be used in place of the platen 151 in any one the polishing modules 100a-j, and 700a, b described above. Here, the linear polishing station 810 comprises a platform 802 having a platen 804 (shown in phantom in FIG. 8B) disposed therein. The polishing pad 808 is typically a belt, i.e., having an endless perimeter, which is moved in along the X-direction using a plurality of rollers 806 disposed on opposite ends of the platform 820 while a substrate (not shown) is urged thereagainst. The polishing station 810 may be used in place of the platen 151 in any one the polishing modules 100a-j and 700a, b described above. Here, the plane G of the carrier support module 120 is orthogonal to, or substantially orthogonal e.g., within 20° of orthogonal to the indexing direction of the polishing pad 816.

Figure 9:
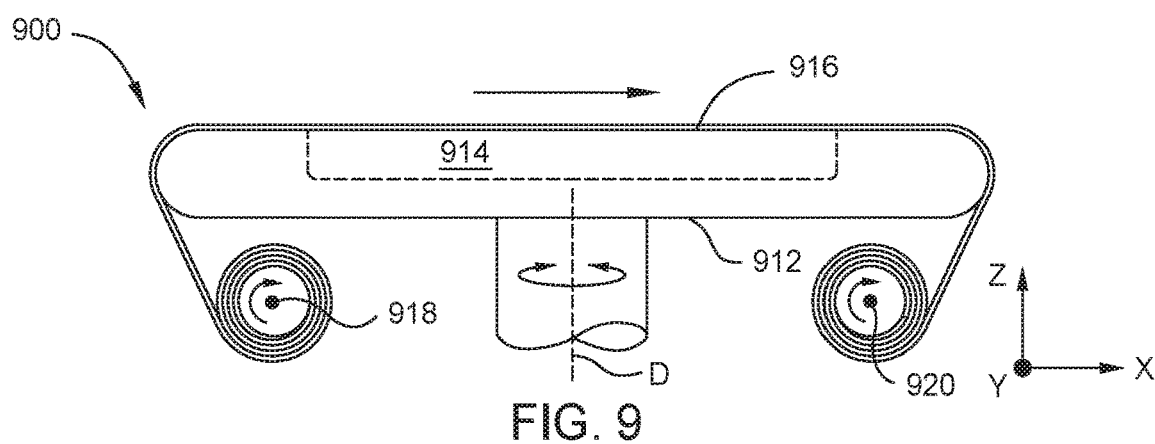
FIG. 9 is a schematic side view of an alternate embodiment of a linear polishing station which may be used with any one or combination of the polishing systems set forth in FIGS. 2-8.

FIG. 9 is a schematic side view of an alternate embodiment of a roll-to-roll polishing pad polishing system 900 that is rotatable about the platen axis D. The roll-to-roll system 900 may be used in place of the platen 151 and polishing pad 152 combination in any of the embodiments described above. Here, the roll-to-roll system 900 includes a platform 912 having a platen 914 (shown in phantom) disposed therein, and a roll-to-roll polishing pad 916 disposed between a supply spindle 918 and a take-up spindle 920. Typically, the polishing pad 916 is indexed in the X-direction between substrate polishing to provide at least a portion of unused polishing pad for the next substrate polishing process.

Beneficially, the polishing modules, the individual components, systems, stations, and robots disposed in the first portions of the modular polishing systems described above, any one or combination of the handling systems set forth above, including individual features or alternative embodiments thereof may be combined in any desired arrangement to provide a customized modular polishing system. The customized modular polishing systems provided are formed of high throughput density polishing modules which lower cost of ownership, maximizes system productivity, and allows flexibility in configurations to meet the specific processing needs of customers using the polishing systems.

Figure 10:
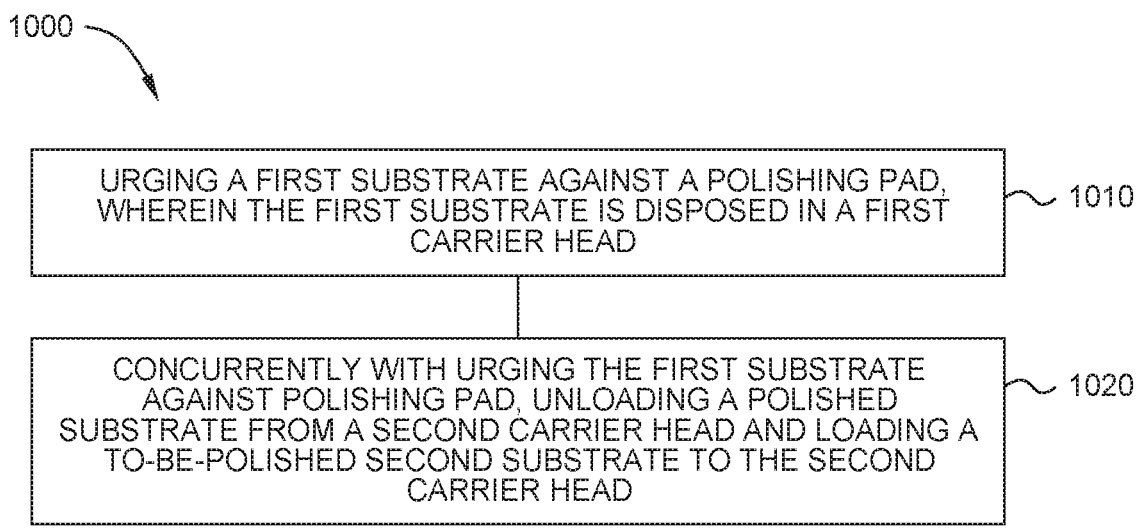
FIG. 10 is a diagram illustrating a substrate processing method that may be performed using a modular polishing system described herein, according to one embodiment.

FIG. 10 is a diagram illustrating a method 1000 of processing substrates which may be performed using any one of the modular polishing systems set forth herein. Typically, the method 1000 is performed using a polishing module, such as the polishing module 100a of FIG. 1A, which is configured for polishing a first substrate using a first carrier head while concurrently unloading and loading respective polished and to-be-polished substrates from and to a second carrier head.

At activity 1010 the method 1000 includes urging a substrate against a polishing pad in the presence of a polishing fluid. Typically, the substrate is disposed in a first carrier head of a first polishing module. At activity 1020 the method 1000 includes concurrently with urging the first substrate against the polishing pad, unloading an at-least-partially-polished substrate from a second carrier head of the first polishing module, and then loading a to-be-polished second substrate to the second carrier head.

In some embodiments, the method 1000 further includes transferring the at-least-partially-polished substrate to a second polishing module using a substrate exchanger, e.g., the inter-module substrate exchanger 350, which is disposed between the first polishing module and the second polishing module.

Figure 11:
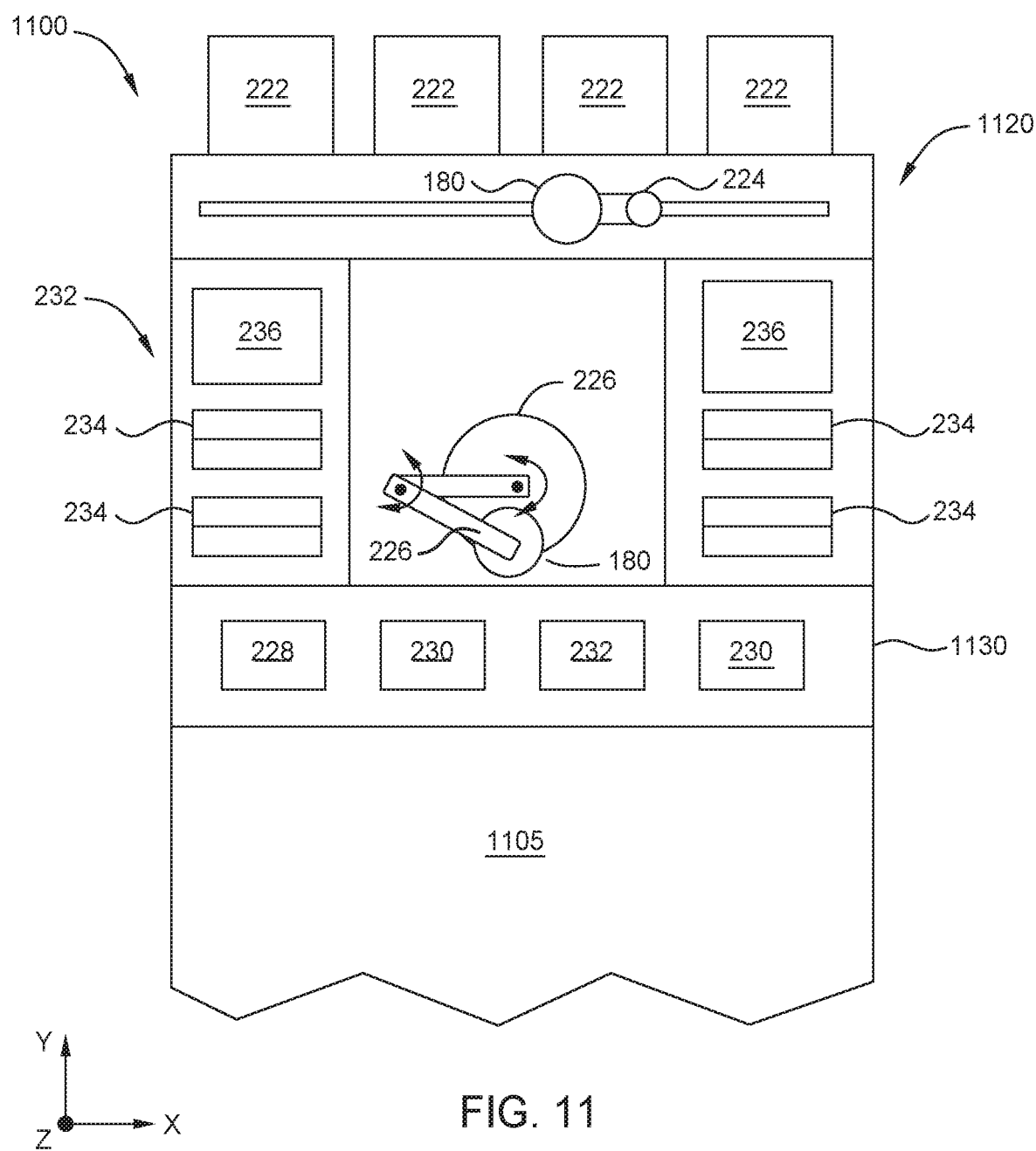
FIG. 11 is a schematic top down sectional view of a modular polishing system, according to another embodiment.

FIG. 11 is a schematic top down view of a modular polishing system 1100, arranged according to another embodiment. Here, the modular polishing system 1100 features a first portion 1120, a second portion 1105, and a third portion 1130 which is disposed between the first portion 1120 and the second portion 1105. The first portion 1120 may be substantially the same as any of the other first portions described herein and may include any one or combination of the features or alternate embodiments thereof. As shown in FIG. 11, the first portion 1120 features a plurality of system loading stations 222, one or more post CMP cleaning systems 232, a first robot 224 for transferring substrates 180 to and from the plurality of system loading stations 222, and a second robot 226. The second portion 1105 generally includes a plurality of polishing modules (not shown) which may be disposed in any of the arrangements described herein. The second portion 1105 may also include one or a combination of a transfer station 216, one or more third robots 314, one or more inter-module substrate exchangers 350, and/or a linear substrate handling system 530, or alternate embodiments thereof disposed in any of the configurations described herein.

Here, the third portion 1130 includes any one or more or combination of LSP modules 230, buffing stations 231, and/or one metrology stations 228. In some embodiments, one or more of the modules and/or stations are stacked vertically, i.e., in the Z-direction. Typically, the second robot 226 is used to transfer substrates 180 to and from the modules and stations disposed in the third portion 1130 and to and from the polishing modules and/or substrate transfer stations in the second portion 1105. For example, here the second robot 226 is configured to extend an end-effector having the substrate 180 secured thereto, e.g., by a vacuum, through the third portion 1130 and into the region defined by the second portion 1105 to load and unload the substrate to and from the polishing modules, substrate handling systems, and/or substrate transfer stations disposed therein.

In the modular polishing systems described above the portion of the system comprising the polishing modules 100 are shown as being distal from the system loading stations 222 while the portions of the system comprising the one or more post CMP cleaning systems 232 are shown as being proximate to the system loading stations 222. However, it is contemplated that the flexibility of the modular systems described herein may be used to facilitate any other desired arrangement of the substrate processing systems, e.g., the polishing, metrology, cleaning, buffing, LSP, loading, and/or handling systems, such as the arrangement of the modular polishing system 1200 shown in FIG. 12.

Figure 12:
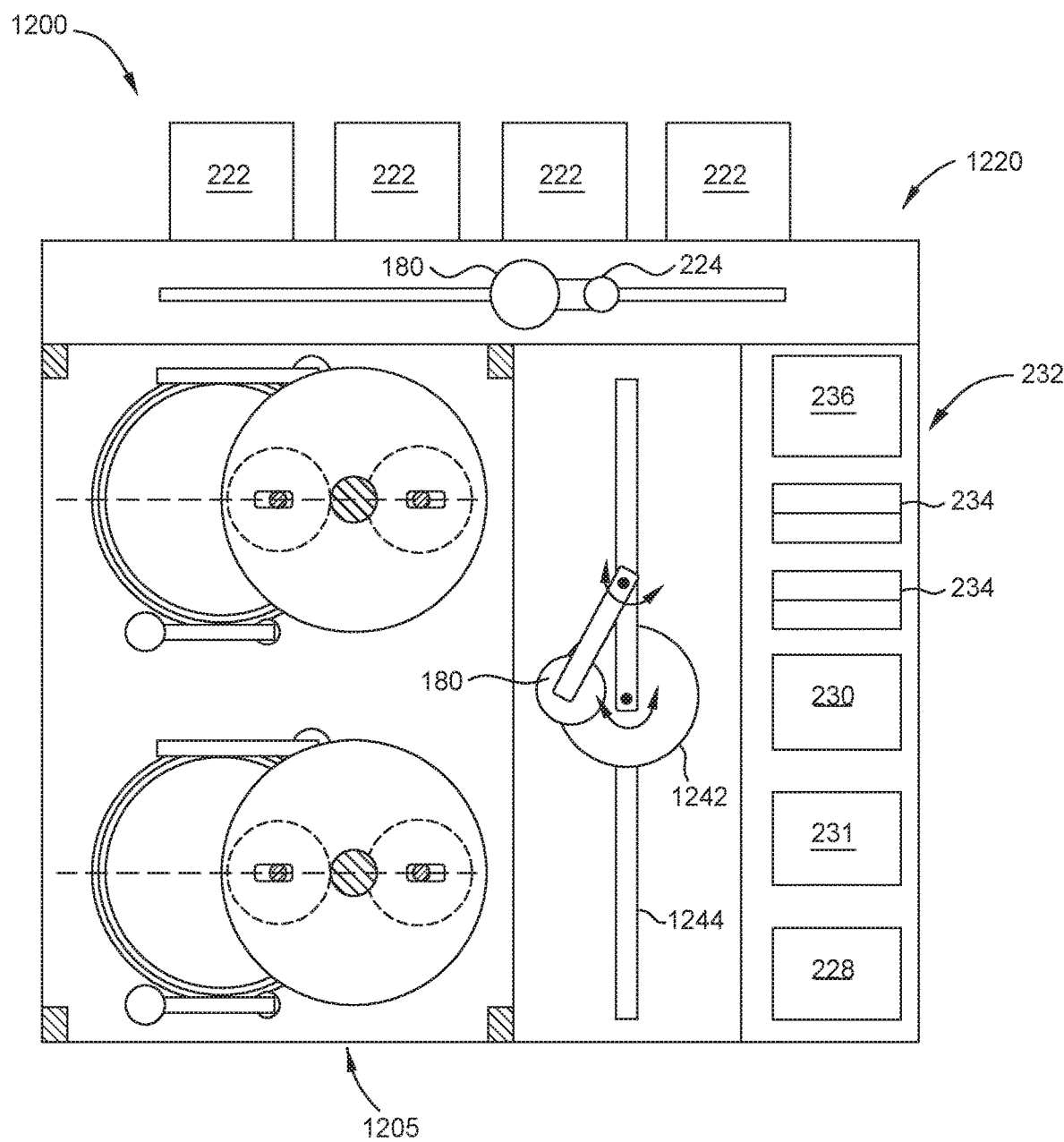
FIG. 12 is a schematic top down sectional view of a modular polishing system, according to another embodiment.

FIG. 12 is a schematic top down view of a modular polishing system 1200, according to another embodiment. Here, the modular polishing system 1200 includes a first portion 1220 and a portion 1205. The first portion 1220 may include one or combination of a plurality of system loading stations 222, a plurality of substrate handlers, here a first robot 224 and a second robot 1224, one or more metrology stations 228, one or more location specific polishing (LSP) modules 230, one or more buffing stations 231, and/or one or more post CMP cleaning systems 232. The second portion 1205 features a plurality of polishing modules 100 disposed in an arrangement which is substantially the same as the second portion 205 of the modular polishing system 200. In other embodiments, the second portion 1205 may comprise any one or combination of the arrangements of the second portions of the other modular polishing systems described herein.

As shown in FIG. 12, at least a part of the second portion 1205 may be disposed proximate to the system loading stations 222 and the first robot 224. The second robot 1242 may be disposed between the one or more post CMP cleaning systems 232 and the second portion 1205. Typically, the second robot 1242 is used to transfer substrates to and from the first robot 224 to the second portion 1205, to and from the one or more post CMP cleaning systems 232 and/or the other modules or systems (228, 230, and/or 231), and between the second portion 1205 and the one or more post CMP cleaning systems 232 and/or the other modules or systems (228, 230, and/or 231). In some embodiments, the second robot 1242 is disposed on a rail or track 1244. In some embodiments, a third portion (not shown), such as the third portion 1130 described in FIG. 11, may be disposed between the second robot 1242 and the second portion 1205.

Figure 13:
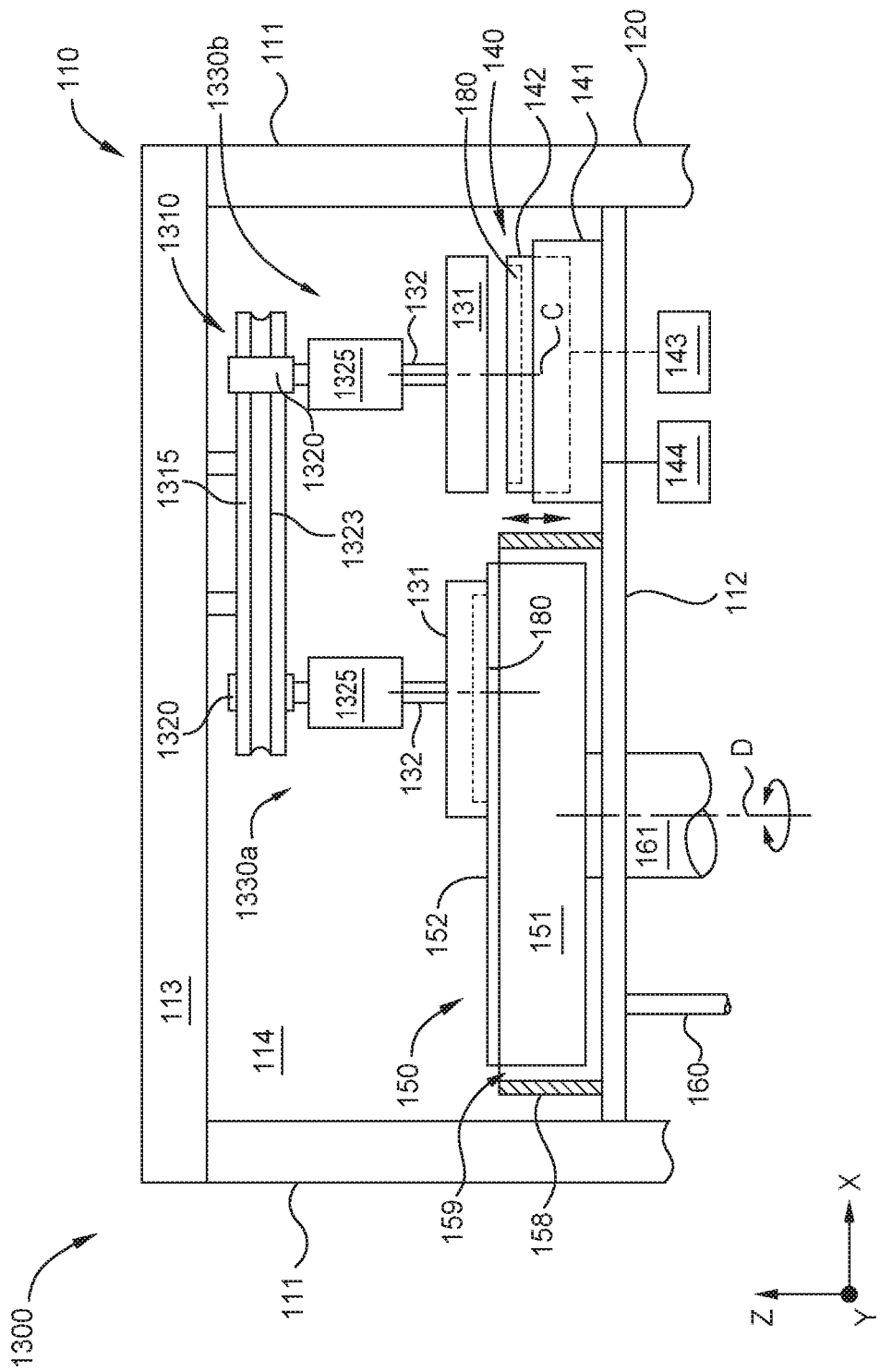
FIG. 13 is a schematic side view of a polishing module, according to another embodiment, which may be used as one or more of a plurality of polishing modules of the modular polishing systems described herein.

FIG. 13 is a schematic side view of a polishing module 1300, according to another embodiment, which may be used as one or more of the plurality of polishing modules in any one of the modular polishing systems described herein. The polishing module 1300 is disposed within a modular frame 110 and includes a carrier support module 1310, a carrier loading station 140, and a polishing station 150 disposed in a one-to-one-to-one relationship. The modular frame 110, the carrier loading station 140, and the polishing station 150 may be substantially the same as those described above with respect to polishing module 100 and may include any one of or combination of the features set forth therein and/or alternate embodiments thereof.

Here, the carrier support module 1310 includes a guide rail assembly 1315 suspended from the overhead support 113. The guide rail assembly 1315 includes a track assembly 1323, one or more carriages 1320 coupled to the track assembly 1323, and one or more corresponding carrier assemblies, here the first and second substrate carrier assemblies 1330a, b, respectively coupled to the one or more carriages 1320.

The guide rail assembly 1315 is generally configured to facilitate loading/unloading of a substrate 180 from a substrate carrier 131 of the second substrate carrier assembly 1330b while concurrently polishing a different substrate 180 using the substrate carrier 131 of the first substrate carrier assembly 1330a. As shown, the track assembly 1323 comprises a closed loop where each of the carriages 1320 may be controlled to move in synchronization, e.g., driven jointly, or independently thereon. The track assembly 1323 may have any suitable shape to fit within a region defined by the frame 110, such as a having a substantially circular or rectangular shape when viewed from top down or even a seemingly random shape when viewed from top down. In other embodiments, the track assembly 1323 may comprise a plurality of individual tracks which may be curved, substantially linear, or have any other desired shapes, when viewed from top down.

The substrate carrier assemblies 1330a, b may include any one or combination of the features, including alternate embodiments thereof, of the substrate carrier assemblies 130a, b of the polishing module 100 at least some of which may be enclosed within a corresponding housing 1325 which is respectively coupled to one of the one or more carriages 1320.

Embodiments, of the modular polishing systems further provide for flexibility in substrate processing sequencing between multiple polishing modules by providing for random (e.g., non-sequential) polishing module access. Random polishing module access desirably improves polishing system throughput by reducing or substantially eliminating substrate processing bottlenecks commonly associated with conventional polishing non-random access polishing systems. For example, in some embodiments a system controller 270 may be used to assign a portion of a substrate processing sequence, such as a second polishing stage of a multi-stage substrate polishing sequence, to a suitably configured polishing module based on the availability thereof. Embodiments herein further provide for substrate handling systems, such as the inter-module substrate exchangers 350, which advantageously reduce the usage burden on more centrally located substrate handlers, e.g., the substrate handling robots 226, 314, and 414. When the combined, the random polishing module access and the substrate handling systems set forth in the modular polishing systems herein provide for relatively higher substrate throughput density when compared to conventional polishing systems.

In some embodiments, the modular polishing systems and substrate handling systems set forth herein may be configured to facilitate high throughput density substrate processing in a multi-stage substrate polishing process. Typically, to facilitate a multi-stage polishing process one or more polishing stations 150 within a modular polishing system will be differently configured from the other polishing stations 150 thereof. For example, differently configured polishing stations 150 may use different types of polishing pads 152, different types of pad conditioners 157, and/or may use one or more different types of polishing fluid during a stage of the substrate polishing process. Typically, the substrate will be polished at a first polishing station for one of the stages in the multi-stage polishing process before being transferred to a second polishing station for a second stage of the multi-stage polishing process. Additional polishing stations may be configured for as many polishing stages as desired.

Beneficially, because of the random polishing module access provided by the substrate handling systems set forth herein, any one of the polishing modules 100 of a modular polishing system may be configured to be used for any desired stage of a multi-stage polishing process. This flexibility for 1-stage, 2-stage, 3-stage, 4-stage or more substrate processing is independent of the location of the correspondingly configured polishing modules within the modular polishing system as the substrate handling systems set forth herein allow for substrate transfer between any of the polishing modules in any desired sequence. In some embodiments, the random polishing module access provided herein may be used to assign a substrate to any desired polishing module configured for the appropriate stage in the multi-stage polishing sequence based on the availability of the polishing module, thus reducing substrate processing bottlenecks often associated with processing duration variability between polishing stations, between polishing stages, and/or between substrates. Thus, the modular polishing systems and substrate processing methods described herein provide for increased utilization of the polishing platens by minimizing the platen down time typically associated with substrate handling operations.

While the foregoing is directed to embodiments of the present disclosure, other and further embodiments of the disclosure may be devised without departing from the basic scope thereof, and the scope thereof is determined by the claims that follow.

The invention claimed is:

1. A modular polishing system, comprising:
a first modular frame defining a first processing region;
a second processing region;
a cleaning system disposed in the first processing region;
a first substrate handler disposed in the first processing region for transferring substrates from the second processing region to the cleaning system;
a plurality of polishing modules disposed in the second processing region, plurality of polishing modules comprising:
a first polishing module frame, defining a first polishing processing region, and a second polishing module frame, defining a second polishing processing region, the first polishing processing region directly adjacent the second polishing processing region, wherein
the first polishing module frame and the second polishing module frame are positioned in a side-by-side arrangement, and
the first polishing module frame and the second polishing module frame are coupled to the first modular frame, and
a third polishing module frame, defining a third polishing processing region, and a fourth polishing module frame, defining a fourth polishing processing region, the third polishing processing region directly adjacent the fourth polishing processing region, wherein
the third polishing module frame and the fourth polishing module frame are positioned in a side-by-side arrangement,
the first polishing module frame is positioned between the first modular frame and the third polishing module frame, and
the second polishing module frame is positioned between the first modular frame and the fourth polishing module frame,
wherein the first, second, third and the fourth polishing module frames each comprise:
a polishing platen rotatable around a platen axis;
a carrier loading station, each carrier loading station having a loading station central axis, wherein the carrier loading station of the first polishing processing region is positioned adjacent to the carrier loading station of the third polishing processing region, and the carrier loading station of the second polishing processing region is positioned adjacent to the carrier loading station of the fourth polishing processing region; and a substrate carrier transport system for moving a first substrate carrier assembly and a second substrate carrier assembly between the polishing platen and the carrier loading station, wherein the substrate carrier transport system positioned between the polishing platen and the carrier loading station, each substrate carrier transport system having a carrier support module, each carrier support module suspended from the polishing module frame, and each carrier support module comprising a carrier platform comprising the first substrate carrier assembly and the second substrate carrier assembly, the carrier platform is rotatable about a platform axis by a platform actuator configured to rotate the first and second substrate carrier assemblies between either a first processing mode position or a second processing mode position; and a second substrate handler disposed in the second processing region and positioned between each first, second, third and fourth polishing processing regions and mounted between and adjacent each carrier loading station, wherein the second substrate handler is configured to transfer substrates between each carrier loading station.

2. The modular polishing system of claim 1, wherein the substrate carrier transport system is configured to concurrently position the first substrate carrier assembly in the first processing mode position and the second substrate carrier assembly in the second processing mode position.

3. The modular polishing system of claim 1, further comprising:

a third substrate processing region disposed between the first processing region and the second processing region;

one or more processing systems disposed in the third substrate processing region, wherein the one or more processing systems comprise one or more location specific polishing modules, one or more metrology stations, one or more buffing stations, or a combination thereof; and the one or more processing systems in the third processing region are disposed in an arrangement that allows substrates to be directly transferred thereto and therefrom using the first substrate handler.

4. The modular polishing system of claim 1, wherein first substrate handler is configured to transfer substrates to and from the substrate transfer station and to and from two or more cleaning stations within the first processing region.

5. The modular polishing system of claim 1, further comprising one or more processing systems disposed in the first processing region, wherein the one or more processing systems comprise one or more location specific polishing modules, one or more metrology stations, one or more buffing stations, or a combination thereof.

6. The modular polishing system of claim 1, further comprising a plurality of system loading stations, wherein the first processing region is disposed between the plurality of system loading stations and the second processing region.

7. The modular polishing system of claim 1, further comprising a plurality of system loading stations, wherein the first substrate handler is disposed between the cleaning system and second processing region, and wherein at least a portion of the one or more polishing module frames is disposed proximate to the plurality of system loading stations.

8. The modular polishing system of claim 1, further comprising a plurality of upright supports, wherein a plurality of panels are disposed between the upright supports, the panels configured to isolate the each polishing processing region from one another.

9. The modular polishing system of claim 1, wherein the first substrate carrier assembly and the second substrate carrier assembly each comprise:

a carrier head coupled to a carrier shaft, wherein the carrier head comprises a chamber, a rotation actuator coupled to the carrier shaft, and configured to rotate the carrier shaft and the carrier head, a translation actuator, and one or more electromechanical components in fluid communication with a chamber disposed within the carrier head, wherein the translation actuator is configured to cause the carrier head, the carrier shaft and the rotational actuator to translate in a first direction that extends perpendicular from the platform axis, and the one or more electromechanical components are fluidly coupled to the carrier head.

10. The modular polishing system of claim 9, wherein each translation actuator and the one or more electromechanical components are positioned on the carrier platform.

11. The modular polishing system of claim 1, wherein the plurality of polishing modules each further comprise a polishing module frame that comprises one or more walls that are configured to isolate each of the polishing modules of the plurality of polishing modules from one another.

12. The modular polishing system of claim 1, further comprising:

a plurality of panels are disposed between adjacent corners of each polishing modular frame, the panels configured to enclose and isolate the polishing processing regions from one another; and a slit shaped opening formed in a panel of the plurality of panels that enclose each polishing processing region, wherein the slit shaped opening is configured to accommodate the transfer of a substrate into and out of the polishing processing regions by the second substrate handler.

13. The modular polishing system of claim 1, wherein the carrier loading station is also a buffing station.

14. A modular polishing system, comprising:

a first processing region;

a second processing region;

a cleaning system disposed in the first processing region;

a first substrate handler disposed in the first processing region for transferring substrates from the second processing region to the cleaning system;

a plurality of polishing modules disposed in the second processing region, each individual polishing module of the plurality of polishing modules having a first side and a second side which is opposite to the first side, each polishing module comprising:

a polishing platen positioned adjacent to the first side and rotatable around a platen central axis;

a carrier loading station positioned adjacent to the second side, each carrier loading station having a loading station central axis; and a substrate carrier transport system positioned between the polishing platen and the carrier loading station and configured to move a first substrate carrier assembly and a second substrate carrier assembly between the polishing platen and the carrier loading station, each substrate carrier transport system having a carrier support module, each carrier support module suspended from a frame of each polishing module disposed in the second processing region, and each carrier support module comprising a carrier platform comprising the first substrate carrier assembly and the second substrate carrier assembly, the carrier platform is rotatable about a platform axis by a platform actuator configured to rotate the first and second substrate carrier assemblies between either a first processing mode position or a second processing mode position, wherein
a first polishing module of the plurality of polishing modules is directly adjacent to a second polishing module of the plurality of polishing modules, the first side of the first polishing module and the first side of the second polishing module are positioned adjacent to the first processing region, a third polishing module of the plurality of polishing modules is directly adjacent to a fourth polishing module of the plurality of polishing modules, the second side of the first polishing module is positioned directly adjacent the second side of the third polishing module, and the second side of the second polishing module is positioned directly adjacent the second side of the fourth polishing module; and a second substrate handler disposed in the second processing region and positioned between each first, second, third and fourth polishing module and mounted between and adjacent each carrier loading station.

15. The modular polishing system of claim 14, wherein each substrate carrier assembly comprises:

a carrier head coupled to a carrier shaft, wherein the carrier head comprises a chamber, a rotation actuator coupled to the carrier shaft, and configured to rotate the carrier shaft and the carrier head, a translation actuator, and one or more electromechanical components is in fluid communication with a chamber disposed within the carrier head, wherein
the translation actuator is configured to cause the carrier head, the carrier shaft and the rotational actuator to translate in a first direction that extends perpendicular from the platform axis, and the one or more electromechanical components are is fluidly coupled to the carrier head.

16. The modular polishing system of claim 15, wherein each translation actuator and the one or more electromechanical components are positioned on the carrier platform.

17. The modular polishing system of claim 14, wherein the substrate carrier transport system is configured to concurrently position the first substrate carrier assembly in the first processing mode position and the second substrate carrier assembly in the second processing mode position.

18. The modular polishing system of claim 14, further comprising:

a third substrate processing region disposed between the first processing region and the second processing region;

one or more processing systems disposed in the third substrate processing region, wherein the one or more processing systems comprise one or more location specific polishing modules, one or more metrology stations, one or more buffing stations, or a combination thereof; and the one or more processing systems in the third processing region are disposed in an arrangement that allows substrates to be directly transferred thereto and therefrom using the first substrate handler.

19. The modular polishing system of claim 14, wherein the first substrate handler is configured to transfer substrates to and from a substrate transfer station and to and from two or more cleaning stations within the first processing region.

20. The modular polishing system of claim 14, further comprising one or more processing systems disposed in the first processing region, wherein the one or more processing systems comprise one or more location specific polishing modules, one or more metrology stations, one or more buffing stations, or a combination thereof.

21. The modular polishing system of claim 14, further comprising a plurality of system loading stations, wherein the first processing region is disposed between the plurality of system loading stations and the second processing region.

22. The modular polishing system of claim 14, further comprising a plurality of system loading stations, wherein the first substrate handler is disposed between the cleaning system and second processing region.

23. The modular polishing system of claim 14, wherein each individual polishing module of the plurality of polishing modules comprise a polishing processing region, and the modular polishing system further comprises:

a plurality of panels are disposed between adjacent corners of each polishing modular frame, the panels configured to enclose and isolate the polishing processing regions from one another; and a slit shaped opening formed in a panel of the plurality of panels that enclose each polishing processing region, wherein the slit shaped opening is configured to accommodate the transfer of a substrate into and out of the polishing processing regions by the second substrate handler.

24. The modular polishing system of claim 14, wherein the carrier loading station is also a buffing station.

\* \* \* \* \*